(12) United States Patent
Son et al.

(10) Patent No.: US 12,354,562 B2
(45) Date of Patent: Jul. 8, 2025

(54) DISPLAY DEVICE AND TILED DISPLAY DEVICE INCLUDING THE SAME

(71) Applicant: Samsung Display Co., LTD., Yongin-si (KR)

(72) Inventors: Sun Kwun Son, Suwon-si (KR); No Kyung Park, Hwaseong-si (KR); Dong Hee Shin, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/977,051

(22) Filed: Oct. 31, 2022

(65) Prior Publication Data
US 2023/0282173 A1    Sep. 7, 2023

(30) Foreign Application Priority Data

Mar. 3, 2022   (KR) .................. 10-2022-0027422

(51) Int. Cl.
*G09G 3/291*    (2013.01)
*G09G 3/32*    (2016.01)
*G09G 3/3291*    (2016.01)

(52) U.S. Cl.
CPC .......... *G09G 3/3291* (2013.01); *G09G 3/32* (2013.01); *G09G 2300/026* (2013.01); *G09G 2300/0426* (2013.01)

(58) Field of Classification Search
CPC ... G09G 2300/0426; G09G 2300/0809; G09G 3/20; G09G 3/3275; G09G 3/3685;
(Continued)

(56) References Cited

U.S. PATENT DOCUMENTS

2013/0050157 A1* 2/2013 Baek .................. G09G 3/2092
345/204
2017/0148374 A1* 5/2017 Lee .................... G02F 1/13336
(Continued)

FOREIGN PATENT DOCUMENTS

CN     110391200     10/2019
CN     114122051     3/2022
(Continued)

OTHER PUBLICATIONS

Extended European Search Report for European Application No. 23159202.3, dated Jul. 31, 2023.

*Primary Examiner* — Dong Hui Liang
(74) *Attorney, Agent, or Firm* — KILE PARK REED & HOUTTEMAN PLLC

(57) ABSTRACT

A display device comprises a first substrate including a first contact hole, fan-out lines included in a first metal layer on the first substrate, first and second pad parts exposed to a lower portion of the first substrate, a display layer disposed on the fan-out lines, and a flexible film disposed below the first substrate, inserted into the first contact hole, and electrically connected to the first and second pad parts. The fan-out lines comprise first fan-out lines extending from the first contact hole in a first direction, and second fan-out lines extending from the first contact hole in a direction opposite to the first direction. The first fan-out lines and the first pad parts are integral with each other. The second fan-out lines and the second pad parts are integral with each other.

17 Claims, 15 Drawing Sheets

(58) Field of Classification Search
CPC .. G09G 3/3674; G09G 3/3266; G09G 3/3291; G09G 3/2092; G09G 3/3611; G09G 2320/0223; G09G 2320/0242; G09G 2320/0233; G09G 2320/02
See application file for complete search history.

(56) References Cited

U.S. PATENT DOCUMENTS

| | | |
|---|---|---|
| 2020/0294471 A1* | 9/2020 | Cross ....................... G09G 5/14 |
| 2021/0013099 A1 | 1/2021 | Pendse |
| 2022/0190074 A1 | 6/2022 | Zhao et al. |
| 2023/0165091 A1* | 5/2023 | Xu ....................... H10K 59/131 257/91 |

FOREIGN PATENT DOCUMENTS

| | | |
|---|---|---|
| KR | 10-2019-0068112 | 6/2019 |
| WO | 2021-258457 | 12/2021 |

* cited by examiner

DISPLAY DEVICE AND TILED DISPLAY DEVICE INCLUDING THE SAME

CROSS-REFERENCE TO RELATED APPLICATION

This application claims priority to and benefits of Korean Patent Application No. 10-2022-0027422 under 35 U.S.C. § 119, filed in the Korean Intellectual Property Office (KIPO) on Mar. 3, 2022, the entire contents of which are incorporated herein by reference.

BACKGROUND

1. Technical Field

The disclosure relates to a display device capable of decreasing heat generation of fan-out lines and preventing a risk of a short-circuit between the fan-out lines and a tiled display device including the same.

2. Description of the Related Art

The importance of display devices as communication media has been emphasized because of the increasing developments of information technology. The display devices have been applied to various electronic devices such as smartphones, digital cameras, laptop computers, navigation devices, and smart televisions. The display devices may be flat panel display devices such as liquid crystal display devices, field emission display devices, or organic light emitting display devices. A light emitting display device of the display devices have grown in popularity given their ability to emit light independently of a separate light source.

When the display device is manufactured in a great size, a defective rate of light emitting elements may increase due to an increase in the number of pixels, and productivity or reliability may decrease. In order to solve such a problem, multiple display devices having a relatively small size are connected to each other, and a tiled display device may realize a screen having a great size. The tiled display device may include boundary portions called seams between the display devices due to non-display areas or bezel areas of each of the display devices adjacent to each other. When an image is displayed on the entire screen, discontinuity may be formed at the boundary portions between the display devices. Thus, a degree of immersion of the image is decreased.

It is to be understood that this background of the technology section is, in part, intended to provide useful background for understanding the technology. However, this background of the technology section may also include ideas, concepts, or recognitions that were not part of what was appreciated by those skilled in the pertinent art prior to a corresponding effective filing date of the subject matter disclosed herein.

SUMMARY

Embodiments provide a display device capable of decreasing heat generation of fan-out lines and preventing a risk of a short-circuit between the fan-out lines, and a tiled display device including the same.

Embodiments also provide a display device capable of removing a recognition of discontinuity between a plurality of display devices and improving a degree of immersion of an image by preventing boundary portions between or non-display areas of the plurality of display devices from being recognized, and a tiled display device including the same.

However, embodiments of the disclosure are not limited to those set forth herein. The above and other embodiments will become more apparent to one of ordinary skill in the art to which the disclosure pertains by referencing the detailed description of the disclosure given below.

According to an embodiment of the disclosure, a display device comprises a first substrate including a first contact hole, fan-out lines included in a first metal layer on the first substrate, at least one first pad part exposed to a lower portion of the first substrate, at least one second pad part exposed to the lower portion of the first substrate, a display layer disposed on the fan-out lines, and a flexible film disposed below the first substrate, inserted into the first contact hole, and electrically connected to the at least one first pad part and the at least one second pad part. The fan-out lines comprise at least one first fan-out line extending from the first contact hole in a first direction, and at least one second fan-out line extending from the first contact hole in a direction opposite to the first direction. The at least one first fan-out line and the at least one first pad part are integral with each other. The at least one second fan-out line and the at least one second pad part are integral with each other.

The at least one first fan-out line may extend to an edge of the first substrate, and the at least one second fan-out line may extend toward a center of the first substrate.

The at least one first pad part may include a plurality of first pad parts, and the at least one second pad part may include a plurality of second pad parts. The plurality of first pad parts and the plurality of second pad parts may be arranged in a second direction intersecting the first direction. The plurality of first pad parts may be disposed at a center of the first contact hole, and the plurality of second pad parts may be disposed on both sides of the plurality of first pad parts.

The at least one first pad part may include a plurality of first pad parts arranged in a second direction intersecting the first direction. The at least one second pad part may include a plurality of second pad parts arranged in the second direction and spaced apart from the plurality of first pad parts in the direction opposite to the first direction.

An area of the at least one second pad part may be greater than an area of the at least one first pad part.

A width of the at least one second fan-out line may be greater than a width of the at least one first fan-out line.

The at least one first fan-out line may supply a data voltage to the display layer, and the at least one second fan-out line may supply a power voltage to the display layer.

The display layer may comprise a data line included in a second metal layer on the first metal layer and extending in the first direction. The data line may intersect the at least one first fan-out line in a plan view.

The display layer may comprise a high potential line included in a second metal layer on the first metal layer and extending in the first direction, and a horizontal voltage line included in a third metal layer on the second metal layer, extending in a second direction intersecting the first direction, and electrically connected to the high potential line. The high potential line may receive a high potential voltage from the at least one second fan-out line.

The display layer may comprise a vertical voltage line included in a second metal layer on the first metal layer and extending in the first direction, and a low potential line included in a third metal layer on the second metal layer, extending in a second direction intersecting the first direction, and electrically connected to the vertical voltage line. The vertical voltage line may receive a low potential voltage from the at least one second fan-out line.

The display device may further comprise a display driver mounted on the flexible film and supplying a data voltage to the display layer.

The display device may further comprise a first barrier insulating layer disposed on the first substrate and including a second contact hole. The at least one first pad part and the at least one second pad part may be inserted into the second contact hole and exposed to the lower portion of the first substrate.

The display device may further comprise a second substrate disposed on the fan-out lines. The second substrate and the first substrate may be formed of a same material. The display layer may be disposed on the second substrate.

The display layer may comprise a connection part included in a second metal layer on the first metal layer, and a data line included in the second metal layer. The data line may be electrically connected to the at least one first fan-out line through the connection part.

The display layer may further comprise a thin film transistor. The thin film transistor may include a semiconductor region included in an active layer on the second metal layer, a drain electrode included in the active layer, a source electrode included in the active layer on the second metal layer, and a gate electrode included in a third metal layer on the active layer. The thin film transistor may receive a data voltage from the data line.

According to an embodiment of the disclosure, a display device comprises a first substrate including a plurality of first contact holes, at least one first fan-out line included in a first metal layer on the first substrate, at least one first pad part exposed to a lower portion of the first substrate, at least one second fan-out line included in the first metal layer, at least one second pad part exposed to the lower portion of the first substrate, a display layer disposed on the at least one first fan-out line and the at least one second fan-out line, at least one first flexible film disposed below the first substrate, inserted into some of the plurality of first contact holes, and electrically connected to the at least one first pad part, and at least one second flexible film disposed below the first substrate, inserted into others of the plurality of first contact holes, and electrically connected to the at least one second pad part. The at least one first fan-out line extend from the at least one first flexible film in a first direction, and the at least one second fan-out line extend from the at least one second flexible film in the first direction. The at least one first fan-out line and the at least one first pad part are integral with each other. The at least one second fan-out line and the at least one second pad part are integral with each other.

The at least one first flexible film may be disposed at an edge of a first long side of the first substrate, and the at least one second flexible film may be disposed at an edge of a second long side of the first substrate opposite to the first long side.

The at least one first fan-out line may extend to an edge of the first substrate, and the at least one second fan-out line may extend toward a center of the first substrate.

The at least one first fan-out line may supply a data voltage to the display layer, and the at least one second fan-out line may supply a power voltage to the display layer.

According to an embodiment of the disclosure, a tiled display device comprises a plurality of display devices each including a display area including a plurality of pixels and a non-display area adjacent to the display area, and a coupling member coupling the plurality of display devices to each other. Each of the plurality of display devices comprises a first substrate including a first contact hole, fan-out lines included in a first metal layer on the first substrate, at least one first pad part exposed to a lower portion of the first substrate, at least one second pad part exposed to the lower portion of the first substrate, a display layer disposed on the fan-out lines, and a flexible film disposed below the first substrate, inserted into the first contact hole, and electrically connected to the at least one first pad part and the at least one second pad part. The fan-out lines include at least one first fan-out line extending from the first contact hole in a first direction, and at least one second fan-out line extending from the first contact hole in a direction opposite to the first direction. The at least one first fan-out line and the at least one first pad part are integral with each other. The at least one second fan-out line and the at least one second pad part are integral with each other.

With a display device and a tiled display device including the same according to embodiments, first fan-out lines supplying a data voltage and second fan-out lines supplying a power voltage may extend in different directions. Thus, a degree of freedom in design of the first and second fan-out lines may be improved, heat generation of the second fan-out lines may be decreased, and a risk of a short-circuit between the first and second fan-out lines may be prevented.

With the display device and the tiled display device including the same according to embodiments, an area of a non-display area of the display device may be minimized by electrically connecting a display driver disposed below a substrate and a connection part disposed on the substrate to each other. Accordingly, the display device and the tiled display device including the same may minimize an interval between adjacent display devices and prevent a user from recognizing non-display areas of or boundary portions between the display devices.

The effects of the disclosure are not limited to the aforementioned effects, and various other effects are included in the specification.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
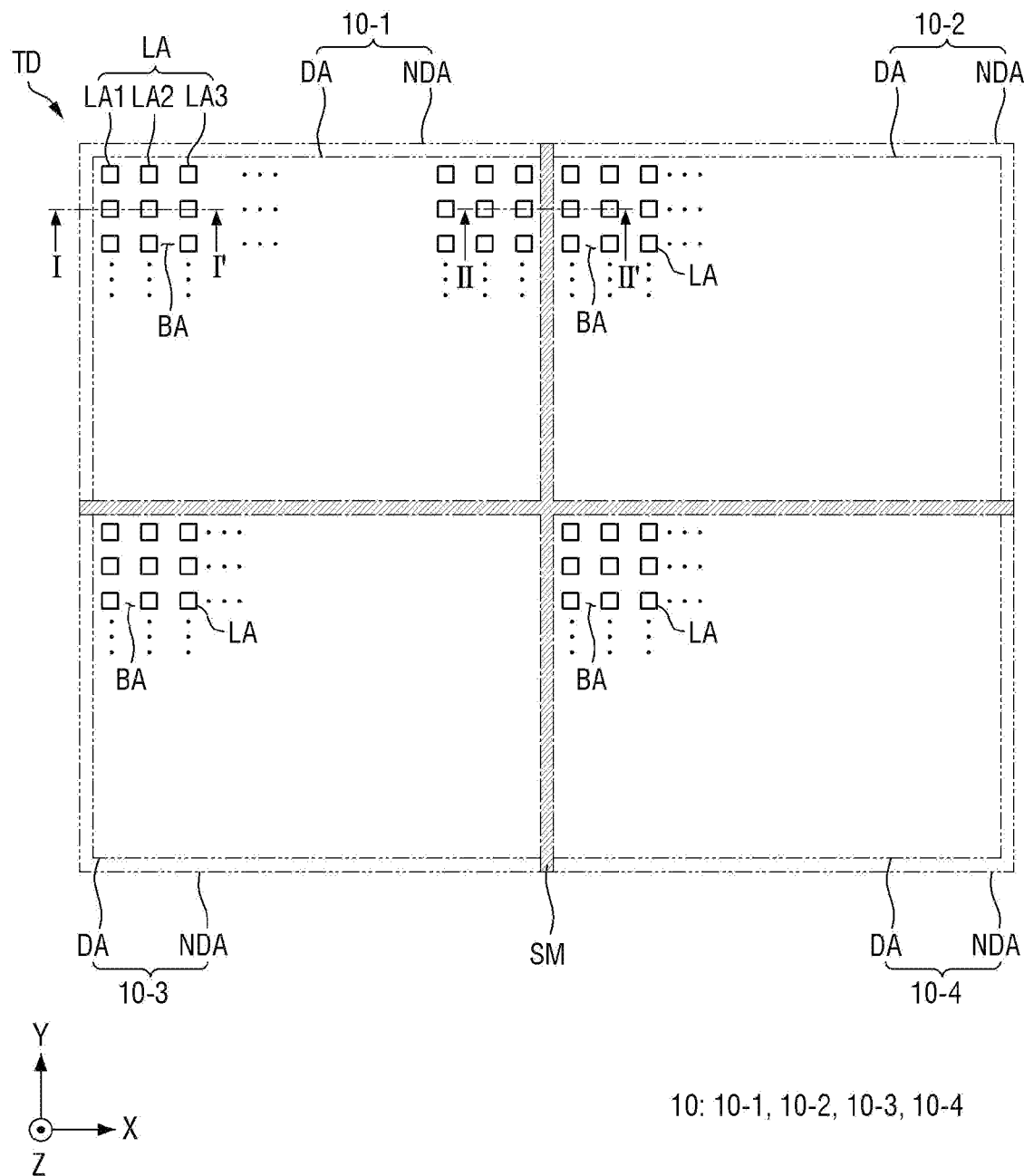
FIG. 1 is a schematic plan view illustrating a tiled display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods employing one or more of the disclosure disclosed herein. It is apparent, however, that various embodiments may be practiced without these specific details or with one or more equivalent arrangements. In other instances, structures and devices are shown in block diagram form in order to avoid unnecessarily obscuring various embodiments. Further, various embodiments may be different, but do not have to be exclusive nor limit the disclosure. For example, specific shapes, configurations, and characteristics of an embodiment may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, ZZ, or the like. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and, as such, are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, detailed embodiments of the disclosure is described with reference to the accompanying drawings.

FIG. 1 is a schematic plan view illustrating a tiled display device according to an embodiment.

Referring to FIG. 1, a tiled display device TD may include display devices 10. The display devices 10 may be arranged in a lattice shape, but are not limited thereto. The display devices 10 may be connected to each other in a first direction (or in an X-axis direction) or in a second direction (or in a Y-axis direction), and the tiled display device TD may have a shape (e.g., a specific or selectable shape). As an example, the display devices 10 may have a same size, but are not limited thereto. As another example, the display devices 10 may have different sizes.

The tiled display device TD may include a first display device 10-1, a second display device 10-2, a third display device 10-3, and a fourth display device 10-4. The number of display devices 10 and a coupling relationship between the display devices 10 are not limited to those of the embodiment of FIG. 1. The number of display devices 10 may be determined according to sizes of each of the display devices 10 and the tiled display device TD.

Each of the display devices 10 may have a rectangular shape including long sides and short sides. The display devices 10 may be disposed with long sides or short sides connected to each other. Some display devices 10 may be disposed at edges of the tiled display device TD, and may form a side of the tiled display device TD. Some other display devices 10 may be disposed at corners of the tiled display device TD, and may form two adjacent sides of the tiled display device TD. Some other display devices 10 may be disposed inside the tiled display device TD, and be adjacent to (e.g., surrounded by) other display devices 10.

Each of the display devices 10 may include a display area DA and a non-display area NDA. The display area DA may include pixels to display an image. Each of the pixels may include an organic light emitting diode including an organic light emitting layer, a quantum dot light emitting diode including a quantum dot light emitting layer, a micro light emitting diode, or an inorganic semiconductor light emitting diode including an inorganic semiconductor. Hereinafter, each of the pixels may include the inorganic light emitting diode, but the disclosure is not limited thereto. The non-display area NDA may be adjacent to (e.g., disposed around) the display area DA and surround the display area DA. The non-display area NDA may not display an image.

The display device 10 may include the pixels arranged along rows and columns in the display area DA. Each of the pixels may include an emission area LA defined by a pixel defining film or a bank, and may emit light having a peak wavelength (e.g., a predetermined or selectable peak wavelength) through the emission area LA. For example, the display area DA of the display device 10 may include a first emission area LA1, a second emission area LA2, and a third emission area LA3. Each of the first to third emission areas LA1, LA2, and LA3 may be an area in which light generated by a light emitting element of the display device 10 is emitted to the outside of the display device 10.

The first to third emission areas LA1, LA2, and LA3 may emit light having a peak wavelength (e.g., a predetermined or selectable peak wavelength) to the outside of the display device 10. The first emission area LA1 may emit light of a first color, the second emission area LA2 may emit light of a second color, and the third emission area LA3 may emit light of a third color. For example, the light of the first color may be red light having a peak wavelength in the range of about 610 nm to about 650 nm, the light of the second color may be green light having a peak wavelength in the range of about 510 nm to about 550 nm, and the light of the third color may be blue light having a peak wavelength in the range of about 440 nm to about 480 nm, but the disclosure is not limited thereto.

The first to third emission areas LA1, LA2, and LA3 may be sequentially and repeatedly disposed in the first direction (or in the X-axis direction) of the display area DA. As an example, an area of the third emission area LA3 may be greater than an area of the first emission area LA1, and the area of the first emission area LA1 may be greater than an area of the second emission area LA2, but the disclosure is not limited thereto. As another example, the first emission area LA1, the second emission area LA2, and the third emission area LA3 may have substantially a same area.

The display area DA of the display device 10 may include light blocking areas BA adjacent to (e.g., surrounding) multiple emission areas LA. The light blocking areas BA may prevent color mixing of light emitted from the first to third emission areas LA1, LA2, and LA3.

The tiled display device TD may have an overall planar shape, but is not limited thereto. The tiled display device TD may have a three-dimensional shape to provide a three-dimensional effect to a user. As an example, when the tiled display device TD has the three-dimensional shape, at least some of the display devices 10 may have a curved shape. As another example, the display devices 10 have a planar shape and are connected to each other at an angle (e.g., a predetermined or selectable angle), and the tiled display device TD may have a three-dimensional shape.

The tiled display device TD may include coupling areas SM disposed between the display areas DA (e.g., disposed between adjacent ones of the display areas DA). The non-display areas NDA of adjacent display devices 10 may be connected to each other, and the tiled display device TD may be formed. The display devices 10 may be connected to each other through coupling members or adhesive members disposed in the coupling areas SM. Each of the coupling areas SM may not include pad parts or flexible films attached to the pad parts. Accordingly, a distance between the display areas DA of each of the display devices 10 may be decreased, and the coupling areas SM may not be recognized by the user. The display areas DA of each of the display devices 10 and the coupling areas SM may have substantially a same external light reflectivity. Accordingly, a sense of discontinuity (e.g., visual discontinuity) between the display devices 10 may be removed from the tiled display device TC, and recognition of the coupling areas SM between the display devices 10 by the user may be prevented. Thus, image display quality (e.g., a degree of immersion of an image) may be improved.

Figure 2:
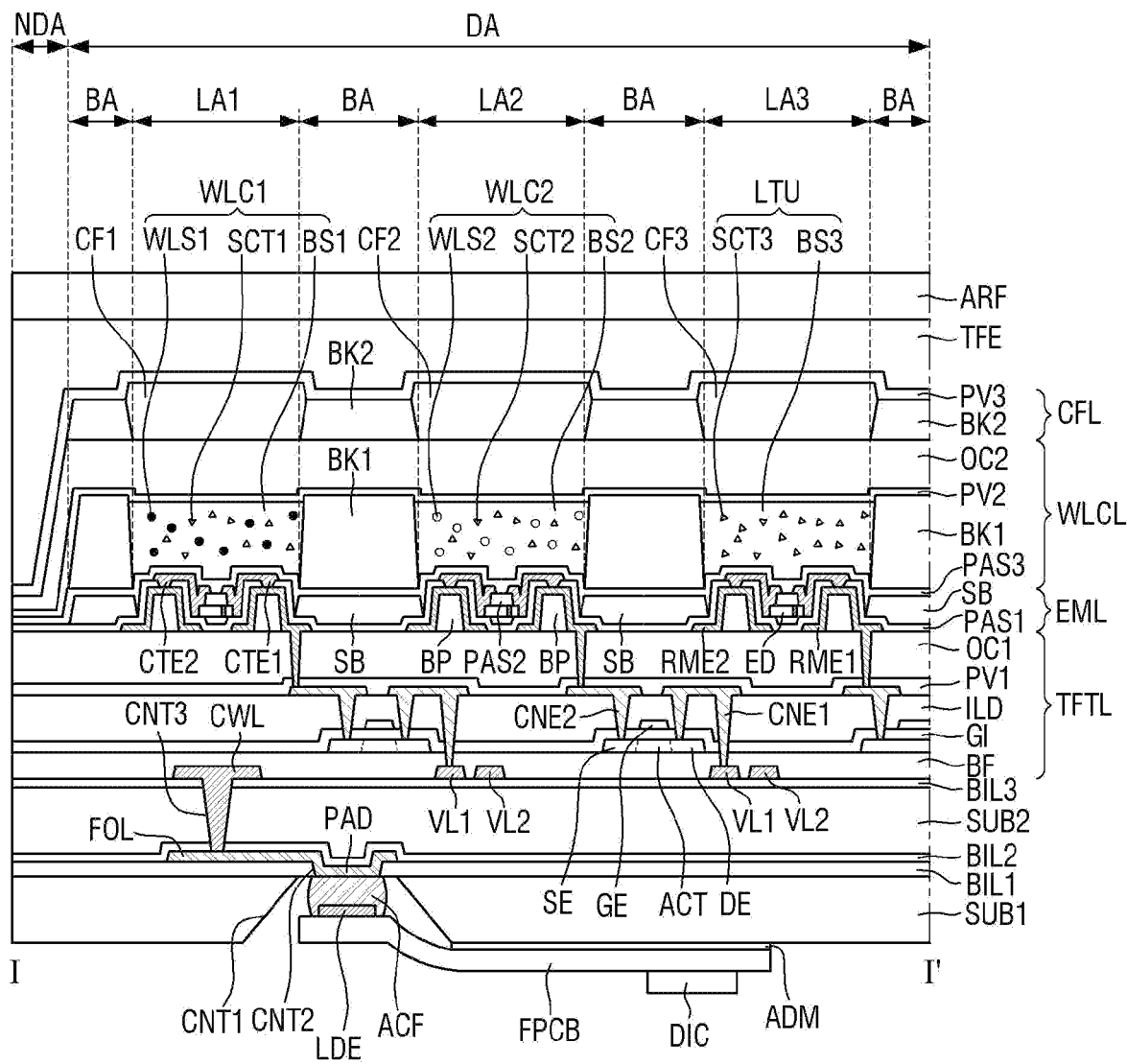
FIG. 2 is a schematic cross-sectional view taken along line I-I' of FIG. 1.

FIG. 2 is a schematic cross-sectional view taken along line I-I' of FIG. 1.

Referring to FIG. 2, the display area DA of the display device 10 may include the first to third emission areas LA1, LA2, and LA3. Each of the first to third emission areas LA1, LA2, and LA3 may be an area in which light generated by light emitting elements ED of the display device 10 is emitted to the outside of the display device 10.

The display device 10 may include a first substrate SUB1, a first barrier insulating layer BIL1 a first metal layer MTL1, a second barrier insulating layer BIL2, a second substrate SUB2, a third barrier insulating layer BIL3, a display layer DPL, an encapsulation layer TFE, an anti-reflection film ARF, a flexible film FPCB, and a display driver DIC.

The first substrate SUB1 may support the display device 10. The first substrate SUB1 may be a base substrate or a base member. The first substrate SUB1 may be a flexible substrate that may be bent, folded, or rolled. As an example, the first substrate SUB1 may include an insulating material such as a polymer resin (e.g., polyimide PI), but is not limited thereto. As another example, the first substrate SUB1 may be a rigid substrate including a glass material.

The first substrate SUB1 may include a first contact hole CNT1. The first contact hole CNT1 may be etched from a lower surface of the first substrate SUB1 and penetrate the first substrate SUB1 to an upper surface of the first substrate SUB1. For example, a width of a lower portion of the first contact hole CNT1 may be greater than a width of an upper portion of the first contact hole CNT1. In a process of manufacturing the display device 10, a pad part PAD may be inserted into a second contact hole CNT2 and exposed by the first contact hole CNT1. The pad part PAD may be electrically connected to a lead electrode LDE of the flexible film FPCB through a connection film ACF inserted into the first contact hole CNT1.

The first barrier insulating layer BIL1 may be disposed on the first substrate SUB1. The first barrier insulating layer BIL1 may include an inorganic film capable of preventing penetration of air or moisture. For example, the first barrier insulating layer BIL1 may include at least one of a silicon nitride layer, a silicon oxynitride layer, a silicon oxide layer, a titanium oxide layer, an aluminum oxide layer, and an amorphous silicon layer, but is not limited thereto.

The first barrier insulating layer BIL1 may include the second contact hole CNT2. The second contact hole CNT2 may be etched from an upper surface of the first barrier insulating layer BIL1 and penetrate the first barrier insulating layer BIL1 to a lower surface of the first barrier insulating layer BIL1. For example, a width of an upper portion of the second contact hole CNT2 may be greater than a width of a lower portion of the second contact hole CNT2.

The first metal layer MTL1 may be disposed on the first barrier insulating layer BIL1. The first metal layer MTL1 may include a fan-out line FOL. The first metal layer MTL1 may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), and copper (Cu).

The pad part PAD and the fan-out line FOL may be integral with each other. The pad part PAD may be inserted into the second contact hole CNT2. The pad part PAD may electrically connect the flexible film FPCB and a connection part CWL to each other. The pad part PAD may be exposed through the first contact hole CNT1 of the first substrate SUB1. The pad part PAD may be electrically connected to the lead electrode LDE of the flexible film FPCB through the connection film ACF. The fan-out line FOL may be electrically connected to a data line, a power line, or a gate line through the connection part CWL. The data line or the power line may be electrically connected to a drain electrode DE of a thin film transistor TFT. The gate line may be electrically connected to a gate electrode GE of the thin film transistor TFT. Accordingly, the fan-out line FOL may supply a data voltage, a power voltage, or a gate signal received from the display driver DIC of the flexible film FPCB to the thin film transistor TFT of the pixel through the connection part CWL. The display device 10 may include the fan-out line FOL disposed in the display area DA, and an area of the non-display area NDA may be minimized.

The second barrier insulating layer BIL2 may be disposed on the first barrier insulating layer BIL1 and the first metal layer MTL1. The second barrier insulating layer BIL2 may include an inorganic film capable of preventing penetration of air or moisture. For example, the second barrier insulating layer BIL2 may include at least one of a silicon nitride layer, a silicon oxynitride layer, a silicon oxide layer, a titanium oxide layer, an aluminum oxide layer, and an amorphous silicon layer, but is not limited thereto.

The second substrate SUB2 may be disposed on the second barrier insulating layer BIL2. The second substrate SUB2 may be a base substrate or a base member. The second substrate SUB2 may be a flexible substrate that may be bent, folded, or rolled. As an example, the second substrate SUB2 may include an insulating material such as a polymer resin (e.g., polyimide PI), but is not limited thereto.

The third barrier insulating layer BIL3 may be disposed on the second substrate SUB2. The third barrier insulating layer BIL3 may include an inorganic film capable of preventing penetration of air or moisture. For example, the third barrier insulating layer BIL3 may include at least one of a silicon nitride layer, a silicon oxynitride layer, a silicon oxide layer, a titanium oxide layer, an aluminum oxide layer, and an amorphous silicon layer, but is not limited thereto.

The third barrier insulating layer BIL3, the second substrate SUB2, and the second barrier insulating layer BIL2 may include a third contact hole CNT3. The third contact hole CNT3 may be etched from an upper surface of the third barrier insulating layer BIL3 and penetrate the third barrier insulating layer BIL3, the second substrate SUB2, and the second barrier insulating layer BIL2 to a lower surface of the second barrier insulating layer BIL2. For example, a width of an upper portion of the third contact hole CNT3 may be greater than a width of a lower portion of the third contact hole CNT3. In the process of manufacturing the display device 10, an upper surface of the fan-out line FOL may be exposed by the third contact hole CNT3, and the fan-out line FOL may be in contact with the connection part CWL inserted into the third contact hole CNT3.

The display layer DPL may be disposed on the third barrier insulating layer BIL3. The display layer DPL may include a thin film transistor layer TFTL a light emitting element layer EML, a wavelength conversion layer WLCL, and a color filter layer CFL. The thin film transistor layer TFTL may include a second metal layer MTL2, a buffer layer BF, an active layer ACTL, a gate insulating layer GI, a third metal layer MTL3, an interlayer insulating layer ILD, a fourth metal layer MTL4, a first passivation layer PV1, and a first planarization layer OC1.

The second metal layer MTL2 may be disposed on the third barrier insulating layer BIL3. The second metal layer MTL2 may include the connection part CWL, a first voltage line VL1, and a second voltage line VL2. The connection part CWL and the first and second voltage lines VL1 and VL2 may be formed of a same material at a same layer, but are not limited thereto. For example, the second metal layer MTL2 may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), and copper (Cu).

The connection part CWL may be inserted into the third contact hole CNT3 and electrically connected to the fan-out line FOL. For example, the connection part CWL may be electrically connected to the data line and supply a data voltage to the thin film transistor TFT. The connection part CWL may be electrically connected to the power line and supply the power voltage to the thin film transistor TFT. The connection part CWL may be electrically connected to the gate line and supply the gate signal to the gate electrode GE of the thin film transistor TFT. Accordingly, the connection part CWL may supply the data voltage, the power voltage, and/or the gate signal received from the display driver DIC to the thin film transistor TFT of the pixel through the fan-out line FOL.

The first and second voltage lines VL1 and VL2 may extend in the second direction (or in the Y-axis direction) in the display area DA. Each of the first and second voltage lines VL1 and VL2 may be electrically connected to the fan-out line FOL. Each of the first and second voltage lines VL1 and VL2 may be electrically connected to the thin film transistor TFT and/or the light emitting element ED. For example, each of the first and second voltage lines VL1 and VL2 may be the data line, a high potential line, a low potential line, or a sensing line, but is not limited thereto.

The buffer layer BF may be disposed on the second metal layer MTL2 and the third barrier insulating layer BIL3. The buffer layer BF may include an inorganic material capable of preventing permeation of air or moisture. For example, the buffer layer BF may include inorganic films that are alternately stacked each other.

The active layer ACTL may be disposed on the buffer layer BF. The active layer ACTL may include a semiconductor region ACT, the drain electrode DE, and a source electrode SE of the thin film transistor TFT. The semiconductor region ACT may overlap the gate electrode GE in a thickness direction (or in a Z-axis direction), and may be electrically insulated from the gate electrode GE by the gate insulating layer GI. The drain electrode DE and the source electrode SE may be provided by making a material of the semiconductor region ACT conductors. For example, portions of the semiconductor region ACT may be implanted by impurities and the drain electrode DE and the source electrode SE may be provided. The thin film transistor TFT may constitute a pixel circuit of each of the pixels. For example, the thin film transistor TFT may be a driving transistor or a switching transistor of the pixel circuit.

The gate insulating layer GI may be disposed on the active layer ACTL and the buffer layer BF. The gate insulating layer GI may electrically insulate the semiconductor region ACT and the gate electrode GE of the thin film transistor TFT from each other. The gate insulating layer GI may include a contact hole through which each of a first connection electrode CNE1 and a second connection electrode CNE2 penetrates the gate insulating layer GI.

The third metal layer MTL3 may be disposed on the gate insulating layer GI. The third metal layer MTL3 may include the gate electrode GE of the thin film transistor TFT. The gate electrode GE may overlap in a plan view (or in the Z-axis direction) the semiconductor region ACT with the gate insulating layer GI interposed therebetween. The gate electrode GE may receive the gate signal from the gate line. For example, the third metal layer MTL3 may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), and copper (Cu).

The interlayer insulating layer ILD may be disposed on the third metal layer MTL3. The interlayer insulating layer ILD may electrically insulate the third and fourth metal layers MTL3 and MTL4 from each other. The interlayer insulating layer ILD may include a contact hole through which each of the first and second connection electrodes CNE1 and CNE2 penetrates the interlayer insulating layer ILD.

The fourth metal layer MTL4 may be disposed on the interlayer insulating layer ILD. The fourth metal layer MTL4 may include the first and second connection electrodes CNE1 and CNE2. The first and second connection electrodes CNE1 and CNE2 may be formed of a same material at a same layer, but are not limited thereto. For example, the fourth metal layer MTL4 may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), and copper (Cu).

The first connection electrode CNE1 may electrically connect the first voltage line VL1 and the drain electrode DE of the thin film transistor TFT to each other. An end of the first connection electrode CNE1 may be in contact with the first voltage line VL1 of the second metal layer MTL2, and another end of the first connection electrode CNE1 may be in contact with the drain electrode DE of the active layer ACTL.

The second connection electrode CNE2 may electrically connect the source electrode SE of the thin film transistor TFT and a first electrode RME1 to each other. An end of the second connection electrode CNE2 may be in contact with the source electrode SE of the active layer ACTL, and the first electrode RME1 of the light emitting element layer EML may be in contact with another end of the second connection electrode CNE2.

The first passivation layer PV1 may be disposed on the fourth metal layer MTL4 and the interlayer insulating layer ILD. The first passivation layer PV1 may protect the thin film transistor TFT. The first passivation layer PV1 may include a contact hole through which the first electrode RME1 penetrates the first passivation layer PV1.

The first planarization layer OC1 may be provided on the first passivation layer PV1 and planarize an upper end (or an upper surface) of the thin film transistor layer TFTL. For example, the first planarization layer OC1 may include a contact hole through which the first electrode RME1 penetrates the first planarization layer OC1. The contact hole of the first planarization layer OC1 may be connected to the contact hole of the first passivation layer PV1. The first planarization layer OC1 may include an organic insulating material such as polyimide (PI).

The light emitting element layer EML may be disposed on the thin film transistor layer TFTL. The light emitting element layer EML may include protrusion patterns BP, the first electrode RME1, a second electrode RME2, a first insulating layer PAS1, a sub-bank SB, light emitting elements ED, a second insulating layer PAS2, a first contact electrode CTE1, a second contact electrode CTE2, and a third insulating layer PAS3.

The protrusion patterns BP may be disposed on the first planarization layer OC1. The protrusion patterns BP may protrude from an upper surface of the first planarization layer OC1. Multiple protrusion patterns BP may be disposed in emission areas LA or opening areas of each of the pixels. Multiple light emitting elements ED may be disposed between the protrusion patterns BP (e.g., adjacent ones of the protrusion patterns BP). The protrusion patterns BP may have inclined side surfaces, and light emitted from the light emitting elements ED may be reflected by the first and second electrodes RME1 and RME2 disposed on the protrusion patterns BP (e.g., disposed on the inclined side surfaces of the protrusion patterns BP). For example, the protrusion pattern BP may include an organic insulating material such as polyimide PI.

The first electrode RME1 may be disposed on the first planarization layer OC1 and the protrusion pattern BP. The first electrode RME1 may be disposed on the protrusion pattern BP disposed on sides of the light emitting elements ED. The first electrode RME1 may be disposed on the inclined side surfaces of the protrusion pattern BP and reflect the light emitted from the light emitting elements ED. The first electrode RME1 may be inserted into the contact holes provided in the first planarization layer OC1 and the first passivation layer PV1 and electrically connected to the second connection electrode CNE2. The first electrode RME1 may be electrically connected to the ends of the light emitting elements ED through the first contact electrode CTE1. For example, the first electrode RME1 may receive a voltage proportional to luminance of the light emitting element ED from the thin film transistor TFT of the pixel.

The second electrode RME2 may be disposed on the first planarization layer OC1 and the protrusion pattern BP. The second electrode RME2 may be disposed on the protrusion pattern BP disposed on another sides of the light emitting elements ED. The second electrode RME2 may be disposed on the inclined side surfaces of the protrusion pattern BP and reflect the light emitted from the light emitting elements ED. The second electrode RME2 may be electrically connected to the another ends of the light emitting elements ED through the second contact electrode CTE2. For example, the second electrode RME2 may receive a low potential voltage supplied to all pixels from the low potential line.

The first and second electrodes RME1 and RME2 may include a conductive material having high reflectivity. As an example, the first and second electrodes RME1 and RME2 may include at least one of aluminum (Al), silver (Ag), copper (Cu), nickel (Ni), and lanthanum (La). As another example, the first and second electrodes RME1 and RME2 may include at least one material of indium tin oxide (ITO), indium zinc oxide (IZO), and indium tin zinc oxide (ITZO). As still another example, the first and second electrodes RME1 and RME2 may include layers having a transparent conductive material layer and a metal layer having high reflectivity or include a single layer including a transparent conductive material and a metal having high reflectivity. The first and second electrodes RME1 and RME2 may have a stacked structure such as ITO/Ag/ITO/, ITO/Ag/IZO, or ITO/Ag/ITZO/IZO.

The first insulating layer PAS1 may be disposed on the first planarization layer OC1 and the first and second electrodes RME1 and RME2. The first insulating layer PAS1 may electrically insulate the first and second electrodes RME1 and RME2 from each other and protect the first and second electrodes RME1 and RME2. The first insulating layer PAS1 may prevent the light emitting elements ED from being in direct contact with the first and second electrodes RME1 and RME2 and damaged by the first and second electrodes RME1 and RME2 in a process of aligning the light emitting elements ED between the first and second electrodes RME1 and RME2.

The sub-bank SB may be disposed in the light blocking areas BA on the first insulating layer PAS1. The sub-bank SB may be disposed at boundaries between the pixels and divide the light emitting elements ED of each of the pixels. The sub-bank SB may have a height (e.g., a predetermined or selectable height) and may include an organic insulating material such as polyimide PI.

The light emitting elements ED may be disposed on the first insulating layer PAS1. The light emitting elements ED may be aligned in parallel with each other between the first and second electrodes RME1 and RME2. A length of the light emitting element ED may be greater than a distance between the first and second electrodes RME1 and RME2. The light emitting element ED may include semiconductor layers, and an end of the light emitting element ED and the another end of the light emitting element ED opposite to the end may be defined on the basis of the semiconductor layers. The end of the light emitting element ED may be disposed on the first electrode RME1, and the another end of the light emitting element ED may be disposed on the second electrode RME2. The end of the light emitting element ED may be electrically connected to the first electrode RME1 through the first contact electrode CTE1, and the another end of the light emitting element ED may be electrically connected to the second electrode RME2 through the second contact electrode CTE2.

The light emitting elements ED may have a size of a micro-meter scale or a nano-meter scale, and may be inorganic light emitting diodes including an inorganic material. The light emitting elements ED may be aligned between the first and second electrodes RME1 and RME2 according to an electric field formed in a direction (e.g., a specific direction) between the first and second electrodes RME1 and RME2 facing each other.

For example, the light emitting elements ED may include active layers having a same material and emit light of a same wavelength band or light of a same color. Light emitted from each of the first to third emission areas LA1, LA2, and LA3 of the light emitting element layer EML may have a same color. For example, the light emitting elements ED may emit light of a third color or blue light having a peak wavelength in the range of about 440 nm to about 480 nm, but are not limited thereto.

The second insulating layer PAS2 may be disposed on the light emitting elements ED. For example, the second insulating layer PAS2 may be adjacent to (e.g., partially surround) the light emitting elements ED and may not cover both ends of each of the light emitting elements ED. The second insulating layer PAS2 may protect the light emitting elements ED and may fix the light emitting elements ED in the process of manufacturing the display device 10. The second insulating layer PAS2 may fill spaces between the light emitting elements ED and the first insulating layer PAS1.

The first contact electrode CTE1 may be disposed on the first insulating layer PAS1, and may be inserted into a contact hole provided in the first insulating layer PAS1 and electrically connected to the first electrode RME1. For example, the contact hole of the first insulating layer PAS1 may be provided on the protrusion pattern BP, but is not limited thereto. An end of the first contact electrode CTE1 may be electrically connected to the first electrode RME1 on the protrusion pattern BP, and another end of the first contact electrode CTE1 may be electrically connected to the ends of the light emitting elements ED.

The second contact electrode CTE2 may be disposed on the first insulating layer PAS1. The second contact electrode CTE2 may be inserted into a contact hole provided in the first insulating layer PAS1 and electrically connected to the second electrode RME2. For example, the contact hole of the first insulating layer PAS1 may be provided on the protrusion pattern BP, but is not limited thereto. The end of the second contact electrode CTE2 may be electrically connected to the another end of the light emitting element ED, and another end of the second contact electrode CTE2 may be electrically connected to the second electrode RME2 on the protrusion pattern BP.

The third insulating layer PAS3 may be disposed on the first and second contact electrodes CTE1 and CTE2, the sub-bank SB, and the first and second insulating layers PAS1 and PAS2. The third insulating layer PAS3 may be disposed on an upper end (or an upper surface) of the light emitting element layer EML and protect the light emitting element layer EML.

The wavelength conversion layer WLCL may be disposed on the light emitting element layer EML. The wavelength conversion layer WLCL may include a first light blocking member BK1, a first wavelength conversion part WLC1, a second wavelength conversion part WLC2, a light transmission part LTU, a second passivation layer PV2, and a second planarization layer OC2.

The first light blocking member BK1 may be disposed in the light blocking areas BA on the third insulating layer PAS3. The first light blocking member BK1 may overlap the sub-bank SB in the thickness direction (or in the Z-axis direction). The first light blocking member BK1 may block transmission of light. The first light blocking member BK1 may prevent colors from being mixed with each other due to permeation of the light between the first to third emission areas LA1, LA2, and LA3 and improve a color reproduction rate of the display device 10. The first light blocking member BK1 may be disposed in the form of a lattice form adjacent to (e.g., surrounding) the first to third emission areas LA1, LA2, and LA3 in a plan view.

The first wavelength conversion part WLC1 may be disposed in the first emission area LA1 on the third insulating layer PAS3. The first wavelength conversion part WLC1 may be adjacent to (e.g., surrounded by) the first light blocking member BK1. The first wavelength conversion part WLC1 may convert or shift a peak wavelength of incident light to a first peak wavelength. The first wavelength conversion part WLC1 may include a first base resin BS1, first scatterers SCT1, and first wavelength shifters WLS1.

The first base resin BS1 may include a material having a relatively high light transmissivity. The first base resin BS1 may be made of a transparent organic material. For example, the first base resin BS1 may include at least one organic material of an epoxy-based resin, an acrylic resin, a cardo-based resin, and an imide-based resin.

The first scatterer SCT1 may have a refractive index different from that of the first base resin BS1, and may form an optical interface with the first base resin BS1. For example, the first scatterer SCT1 may include a light scattering material or a light scattering particle scattering at least a portion of transmitted light. For example, the first scatterer SCT1 may include at least one metal oxide of titanium oxide ($TiO_2$), zirconium oxide ($ZrO_2$), aluminum oxide ($Al_2O_3$), indium oxide ($In_2O_3$), zinc oxide (ZnO), and tin oxide ($SnO_2$). In other embodiments, the first scatterer SCT1 may include an organic particle such as an acrylic resin or a urethane-based resin. The first scatterer SCT1 may scatter light in a random direction regardless of an incident direction of incident light without substantially converting a peak wavelength of the incident light.

The first wavelength shifter WLS1 may convert or shift the peak wavelength of the incident light to the first peak wavelength. For example, the first wavelength shifter WLS1 may convert the blue light provided from the display device 10 into red light having a single peak wavelength in the range of about 610 nm to about 650 nm and emit the red light. The first wavelength shifter WLS1 may be a quantum dot, a quantum rod, or a phosphor. The quantum dot may be a particulate matter (or particles) emitting a color (e.g., a specific color) and electrons may be transitioned from a conduction band to a valence band in the quantum dot.

A portion of the blue light provided from the light emitting element layer EML may be transmitted through the first wavelength conversion part WLC1 without being converted into the red light by the first wavelength shifter WLS1. Light incident on a first color filter CF1 without being converted by the first wavelength conversion part WLC1 in the blue light provided from the light emitting element layer EML may be blocked by the first color filter CF1. The red light converted by the first wavelength conversion part WLC1 in the blue light provided from the light emitting element layer EML may be transmitted through the first color filter CF1 and emitted to the outside. For example, although the first wavelength conversion part WLC1 may not completely convert the blue light, the first color filter CF1 may block the unconverted portion of the light, and the red light may be emitted to the outside. Accordingly, the first emission area LA1 may emit the red light.

The second wavelength conversion part WLC2 may be disposed in the second emission area LA2 on the third insulating layer PASS. The second wavelength conversion part WLC2 may be adjacent to (e.g., surrounded by) the first light blocking member BK1. The second wavelength conversion part WLC2 may convert or shift a peak wavelength of incident light to a second peak wavelength. The second wavelength conversion part WLC2 may include a second base resin BS2, second scatterers SCT2, and second wavelength shifters WLS2.

The second base resin BS2 may include a material having a relatively high light transmissivity. The second base resin BS2 may be made of a transparent organic material. For example, the second base resin BS2 and the first base resin BS1 may be made of a same material.

The second scatterer SCT2 may have a refractive index different from that of the second base resin BS2, and may form an optical interface with the second base resin BS2. For example, the second scatterer SCT2 may include a light scattering material or a light scattering particle scattering at least a portion of transmitted light. For example, the second scatterer SCT2 and the first scatterer SCT1 may be made of a same material.

The second wavelength shifter WLS2 may convert or shift the peak wavelength of the incident light to the second peak wavelength different from the first peak wavelength of the first wavelength shifter WLS1. For example, the second wavelength shifter WLS2 may convert the blue light provided from the display device 10 into green light having a single peak wavelength in the range of about 510 nm to about 550 nm and emit the green light. The second wavelength shifter WLS2 may be a quantum dot, a quantum rod, or a phosphor. The second wavelength shifter WLS2 and the first wavelength shifter WLS1 may have a same material. The second wavelength shifter WLS2 may be formed as a quantum dot, a quantum rod, or a phosphor, and a wavelength conversion range of the second wavelength shifter WLS2 may be different from the wavelength conversion range of the first wavelength shifter WLS1.

The light transmission part LTU may be disposed in the third emission area LA3 on the third insulating layer PAS3. The light transmission part LTU may be adjacent to (e.g., surrounded by) the first light blocking member BK1. The light transmission part LTU may transmit incident light therethrough and maintain a peak wavelength of the incident light. The light transmission part LTU may include a third base resin BS3 and third scatterers SCT3.

The third base resin BS3 may include a material having a relatively high light transmissivity. The third base resin BS3 may be made of a transparent organic material. For example, the third base resin BS3 and the first base resin BS1 (or the second base resin BS2) may be made of a same material.

The third scatterer SCT3 may have a refractive index different from that of the third base resin BS3, and may form an optical interface with the third base resin BS3. For example, the third scatterer SCT3 may include a light scattering material or a light scattering particle scattering at least a portion of transmitted light. For example, the third scatterer SCT3 and the first scatterer SCT1 (or the second scatterer SCT2) may be made of a same material.

Since the wavelength conversion layer WLCL is disposed (e.g., directly disposed) on the third insulating layer PAS3 of the light emitting element layer EML, the display device 10 may not require a separate substrate for the first and second wavelength conversion parts WLC1 and WLC2 and the light transmission part LTU. Accordingly, the first and second wavelength conversion parts WLC1 and WLC2 and the light transmission part LTU may be readily aligned in the first to third emission areas LA1, LA2, and LA3, respectively, and a thickness of the display device 10 may be relatively decreased.

The second passivation layer PV2 may cover the first and second wavelength conversion parts WLC1 and WLC2, the light transmission part LTU, and the first light blocking member BK1. For example, the second passivation layer PV2 may seal the first and second wavelength conversion parts WLC1 and WLC2 and the light transmission part LTU and prevent damage to or contamination of the first and second wavelength conversion parts WLC1 and WLC2 and the light transmission part LTU. For example, the second passivation layer PV2 may include an inorganic material.

The second planarization layer OC2 may be disposed on the second passivation layer PV2 and planarize upper ends (or upper surfaces) of the first and second wavelength conversion parts WLC1 and WLC2 and the light transmission part LTU. For example, the second planarization layer OC2 may include an organic insulating material such as polyimide (PI).

The color filter layer CFL may be disposed on the wavelength conversion layer WLCL. The color filter layer CFL may include a second light blocking member BK2, the first color filter CF1, a second color filter CF2, a third color filter CF3, and a third passivation layer PV3.

The second light blocking member BK2 may be disposed in the light blocking areas BA on the second planarization layer OC2 of the wavelength conversion layer WLCL. The second light blocking member BK2 may overlap the first light blocking member BK1 or the sub-bank SB in the thickness direction (or in the Z-axis direction). The second light blocking member BK2 may block transmission of light. The second light blocking member BK2 may prevent colors from being mixed with each other due to permeation of the light between the first to third emission areas LA1, LA2, and LA3 and improve a color reproduction rate of the display device 10. The second light blocking member BK2 may be disposed in the form of a lattice adjacent to (e.g., surrounding) the first to third emission areas LA1, LA2, and LA3 in a plan view.

The first color filter CF1 may be disposed in the first emission area LA1 on the second planarization layer OC2. The first color filter CF1 may be adjacent to (e.g., surrounded by) the second light blocking member BK2. The first color filter CF1 may overlap the first wavelength conversion part WLC1 in the thickness direction (or in the Z-axis direction). The first color filter CF1 may selectively transmit light of the first color (e.g., the red light) and block or absorb light of the second color (e.g., the green light) and light of the third color (e.g., the blue light). For example, the first color filter CF1 may be a red color filter and include a red colorant.

The second color filter CF2 may be disposed in the second emission area LA2 on the second planarization layer OC2. The second color filter CF2 may be adjacent to (e.g., surrounded by) the second light blocking member BK2. The second color filter CF2 may overlap the second wavelength conversion part WLC2 in the thickness direction (or in the Z-axis direction). The second color filter CF2 may selectively transmit the light of the second color (e.g., the green light) and block or absorb the light of the first color (e.g., the red light) and the light of the third color (e.g., the blue light). For example, the second color filter CF2 may be a green color filter and include a green colorant.

The third color filter CF3 may be disposed in the third emission area LA3 on the second planarization layer OC2. The third color filter CF3 may be adjacent to (e.g., surrounded by) the second light blocking member BK2. The third color filter CF3 may overlap the light transmission part LTU in the thickness direction (or in the Z-axis direction). The third color filter CF3 may selectively transmit the light of the third color (e.g., the blue light) and block or absorb the light of the first color (e.g., the red light) and the light of the second color (e.g., the green light). For example, the third color filter CF3 may be a blue color filter and include a blue colorant.

The first to third color filters CF1, CF2, and CF3 may absorb a portion of light introduced from the outside of the display device 10 and reduce reflected light due to external light. Therefore, the first to third color filters CF1, CF2, and CF3 may prevent distortion of colors due to external light reflection.

Since the first to third color filters CF1, CF2, and CF3 are disposed (e.g., directly disposed) on the second planarization layer OC2 of the wavelength conversion layer WLCL, the display device 10 may not require a separate substrate for the first to third color filters CF1, CF2, and CF3. Accordingly, a thickness of the display device 10 may be relatively decreased.

The third passivation layer PV3 may cover the first to third color filters CF1, CF2, and CF3, and the second light blocking member BK2. The third passivation layer PV3 may protect the first to third color filters CF1, CF2, and CF3.

The encapsulation layer TFE may be disposed on the third passivation layer PV3 of the color filter layer CFL. The encapsulation layer TFE may cover an upper surface and side surfaces of the display layer DPL. For example, the encapsulation layer TFE may include at least one inorganic film and prevent permeation of oxygen or moisture. The encapsulation layer TFE may include at least one organic film and protect the display device 10 from foreign matters such as dust.

The anti-reflection film ARF may be disposed on the encapsulation layer TFE. The anti-reflection film ARF may prevent reflection of external light, and visibility of the display device 10 may not be decreased due to the reflection of the external light. The anti-reflection film ARF may protect an upper surface of the display device 10. In other embodiments, the anti-reflection film ARF may be omitted. As another example, the antireflection film ARF may be replaced with a polarizing film.

The flexible film FPCB may be disposed below the first substrate SUB1. The flexible film FPCB may be disposed at an edge of a lower surface of the display device 10. The flexible film FPCB may be attached to a lower surface of the first substrate SUB1 using an adhesive member ADM. The flexible film FPCB may include the lead electrode LDE disposed on an upper surface of a side of the flexible film FPCB. The lead electrode LDE may be inserted into the first contact hole CNT1 and electrically connected to the pad part PAD through the connection film ACF. The flexible film FPCB may support the display driver DIC disposed on a lower surface of another side of the flexible film FPCB. The lead electrode LDE may be electrically connected to the display driver DIC through a lead line (not illustrated) disposed on the lower surface of the flexible film FPCB. The another side of the flexible film FPCB may be connected to a source circuit board (not illustrated) below the first substrate SUB1. The flexible film FPCB may transmit a signal and a voltage of the display driver DIC to the display device 10.

The connection film ACF may attach the lead electrode LDE of the flexible film FPCB to the pad part PAD. A surface of the connection film ACF may be attached to the pad part PAD, and another surface of the connection film ACF may be attached to the lead electrode LDE. For example, the connection film ACF may include an anisotropic conductive film. When the connection film ACF includes the anisotropic conductive film, the connection film ACF may have conductivity (e.g., electrical conductivity) in regions with which the pad part PAD and the lead electrode LDE are in contact, and may electrically connect the flexible film FPCB to the fan-out line FOL.

The display driver DIC may be mounted on the flexible film FPCB. The display driver DIC may be an integrated circuit (IC). The display driver DIC may convert digital video data into an analog data voltage based on a data control signal received from a timing controller (not illustrated), and may supply the analog data voltage to the data line of the display area DA through the flexible film FPCB. The display driver DIC may supply the power voltage received from a power supply part (not illustrated) to the power line of the display area DA through the flexible film FPCB. The display driver DIC may generate gate signals based on gate control signals, and may sequentially supply the gate signals to gate lines according to an order (e.g., a set order). The display device 10 may include the fan-out line FOL disposed on the first substrate SUB1 and the display driver DIC disposed below the first substrate SUB1. Thus, an area of the non-display area NDA may be minimized.

Figure 3:
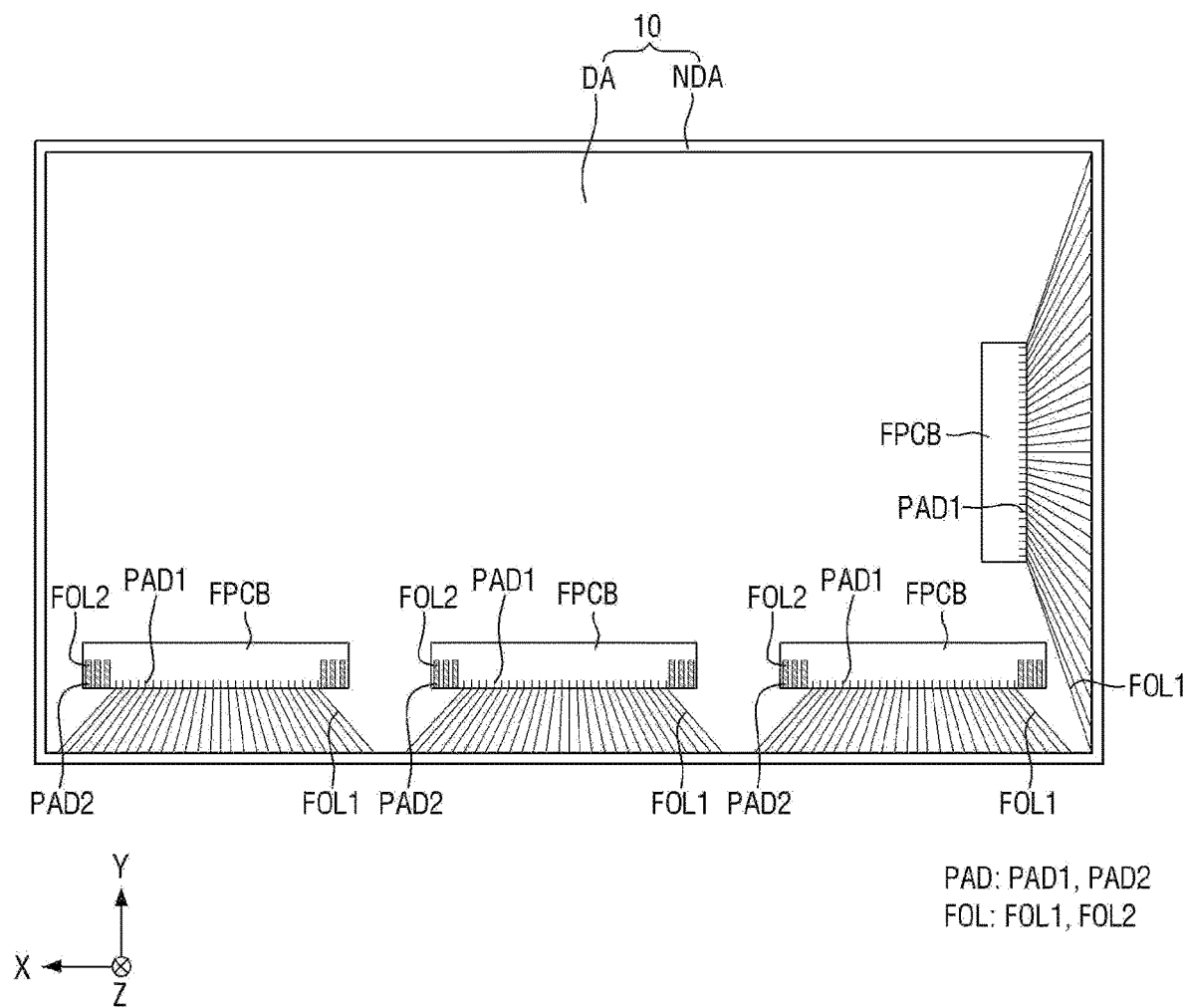
FIG. 3 is a schematic bottom view illustrating a display device according to an embodiment.
Figure 4:
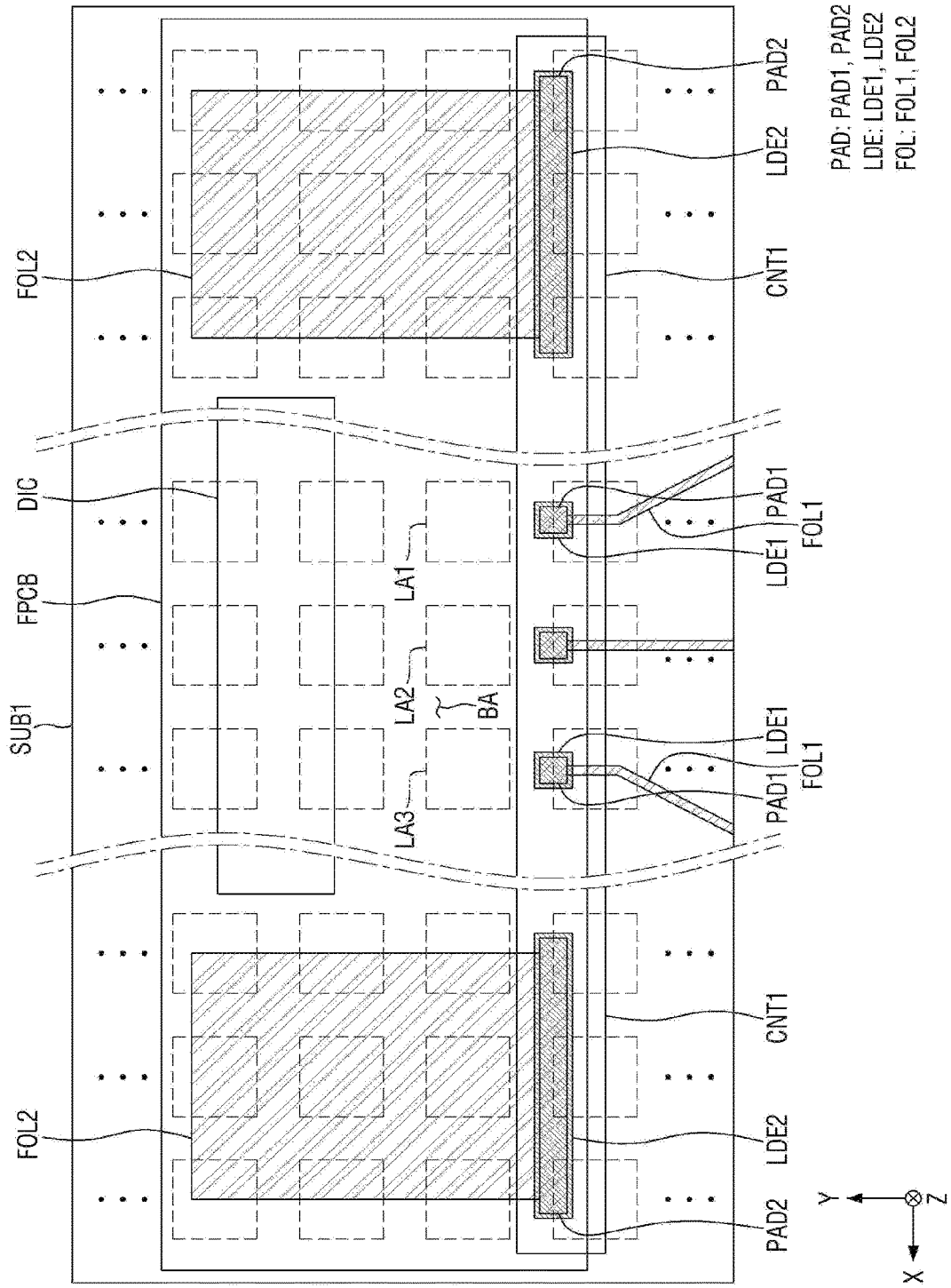
FIG. 4 is a schematic enlarged bottom view illustrating a portion of the display device according to an embodiment.

FIG. 3 is a schematic bottom view illustrating a display device according to an embodiment, and FIG. 4 is a schematic enlarged bottom view illustrating a portion of the display device according to an embodiment.

Referring to FIGS. 3 and 4, the flexible film FPCB, the pad part PAD, and the fan-out line FOL may be disposed in the display area DA.

The flexible film FPCB may be disposed below the first substrate SUB1. The flexible film FPCB may be disposed at the edge of the lower surface of the display device 10. For example, multiple flexible films FPCB may be disposed at the edge of the lower surface of the display device 10, and some of the flexible films FPCB may be disposed at an edge of a long side of the display device 10, and others of the flexible films FPCB may be disposed at an edge of a short side of the display device 10. The flexible films FPCB disposed at the edge of the long side of the display device 10 may supply data voltages and power voltages, and the flexible films FPCB disposed at the edge of the short side of the display device 10 may supply gate signals, but the disclosure is not limited thereto.

The pad part PAD may include first pad parts PAD1 and second pad parts PAD2. The first and second pad parts PAD1 and PAD2 may be inserted into the second contact holes CNT2 of the first barrier insulating layer BILL and may be exposed through the first contact holes CNT1 of the first substrate SUB1. The first and second pad parts PAD1 and PAD2 disposed at the edge of the long side of the display device 10 may be arranged in the first direction (or in the X-axis direction). The first pad parts PAD1 disposed at the edge of the short side of the display device 10 may be arranged in the second direction (or in the Y-axis direction). At the edge of the long side of the display device 10, the first pad parts PAD1 may be disposed at a center of the first contact hole CNT1, and the second pad parts PAD2 may be disposed on sides (e.g., both sides) of the first pad parts PAD1.

As an example, an area of the second pad part PAD2 may be greater than an area of each of the first pad parts PAD1. The first pad parts PAD1 may be individual pads, and the second pad part PAD2 may be an integrated pad. For example, the first pad parts PAD1 may be individually connected to lines (e.g., data lines DL, sensing lines SL of FIG. 5 or the like), respectively, and each of the second pad parts PAD2 may be integrally connected to multiple lines (e.g., high potential lines VDL of FIG. 6). However, the disclosure is not limited thereto. The area of the second pad part PAD2 may be several to several tens of times the area of the first pad part PAD1. As another example, the first and second pad parts PAD1 and PAD2 may be individual pads having a same size.

The fan-out line FOL may include first and second fan-out lines FOL1 and FOL2. The first fan-out lines FOL1 and the first pad parts PAD1 may be integral with each other. The first fan-out lines FOL1 may extend from the first pad parts PAD1 to an edge of the display device 10 or the first substrate SUB1. For example, the first fan-out lines FOL1 disposed at the edge of the long side of the display device 10 may extend in a direction opposite to the second direction (or to the Y-axis direction) of the first contact holes CNT1. The first fan-out lines FOL1 disposed at the edge of the short side of the display device 10 may extend in a direction opposite to the first direction (or to the X-axis direction) of the first contact holes CNT1. For example, some of the first fan-out lines FOL1 may extend from the first contact holes CNT1 in the direction opposite to the second direction (or to the Y-axis direction), and others of the first fan-out lines FOL1 may extend from the first contact holes CNT1 in the direction opposite to the first direction (or to the X-axis direction). The first fan-out lines FOL1 may be electrically connected to the data lines or the gate lines of the display area DA through the connection parts CWL (e.g., refer to FIG. 2).

The second fan-out lines FOL2 and the second pad parts PAD2 may be integral with each other. The second fan-out lines FOL2 may extend from the second pad parts PAD2 toward the center of the display device 10 or the first substrate SUB1. For example, the second fan-out lines FOL2 may extend in the second direction (or in the Y-axis direction) of the first contact holes CNT1. For example, the second fan-out lines FOL2 may extend from the first contact holes CNT1 in the second direction (or in the Y-axis direction). The second fan-out lines FOL2 may be electrically connected to power lines of the display area DA through the connection parts CWL. For example, a width of the second fan-out line FOL2 may be greater than a width of the first fan-out line FOL1. In some embodiments, the width of the second fan-out line FOL2 may be several to several tens of times the width of the first fan-out line FOL1. The second fan-out lines FOL2 may extend in a direction different from that of the first fan-out lines FOL1. Thus, an interval between the first and second fan-out lines FOL1 and FOL2 may be increased and a degree of freedom in design of the first and second fan-out lines FOL1 and FOL2 may be improved. The second fan-out line FOL2 may have a relatively great width, and line resistance may be relatively decreased. Accordingly, the display device 10 may decrease heat generation of the second fan-out lines FOL2, and may prevent a risk of a short-circuit between the first and second fan-out lines FOL1 and FOL2.

The lead electrode LDE of the flexible film FPCB may include first lead electrodes LDE1 and second lead electrodes LDE2. Each of first pad parts PAD1 may correspond to each of the first lead electrodes LDE1. The first lead electrode LDE1 may be electrically connected to the first pad part PAD1 through the connection film ACF. Each of the second pad parts PAD2 may correspond to each of the second lead electrodes LDE2. The second lead electrode LDE2 may be electrically connected to the second pad part PAD2 through the connection film ACF. As an example, an area of the second lead electrode LDE2 may be greater than an area of the first lead electrode LDE1. The first lead electrodes LDE1 may be individual electrodes, and the second lead electrode LDE2 may be an integrated electrode, but the disclosure is not limited thereto. For example, the first lead electrodes LDE1 may be individually connected to the lines (e.g., the data lines DL, the sensing lines SL of FIG. 5 or the like), respectively, and each of the second lead electrodes LDE2 may be integrally connected to the multiple lines (e.g., the high potential lines VDL of FIG. 6). The area of the second lead electrode LDE2 may be several to several tens of times the area of the first lead electrode LDE1. As another example, the first and second lead electrodes LDE1 and LDE2 may be individual pads having a same size.

Figure 5:
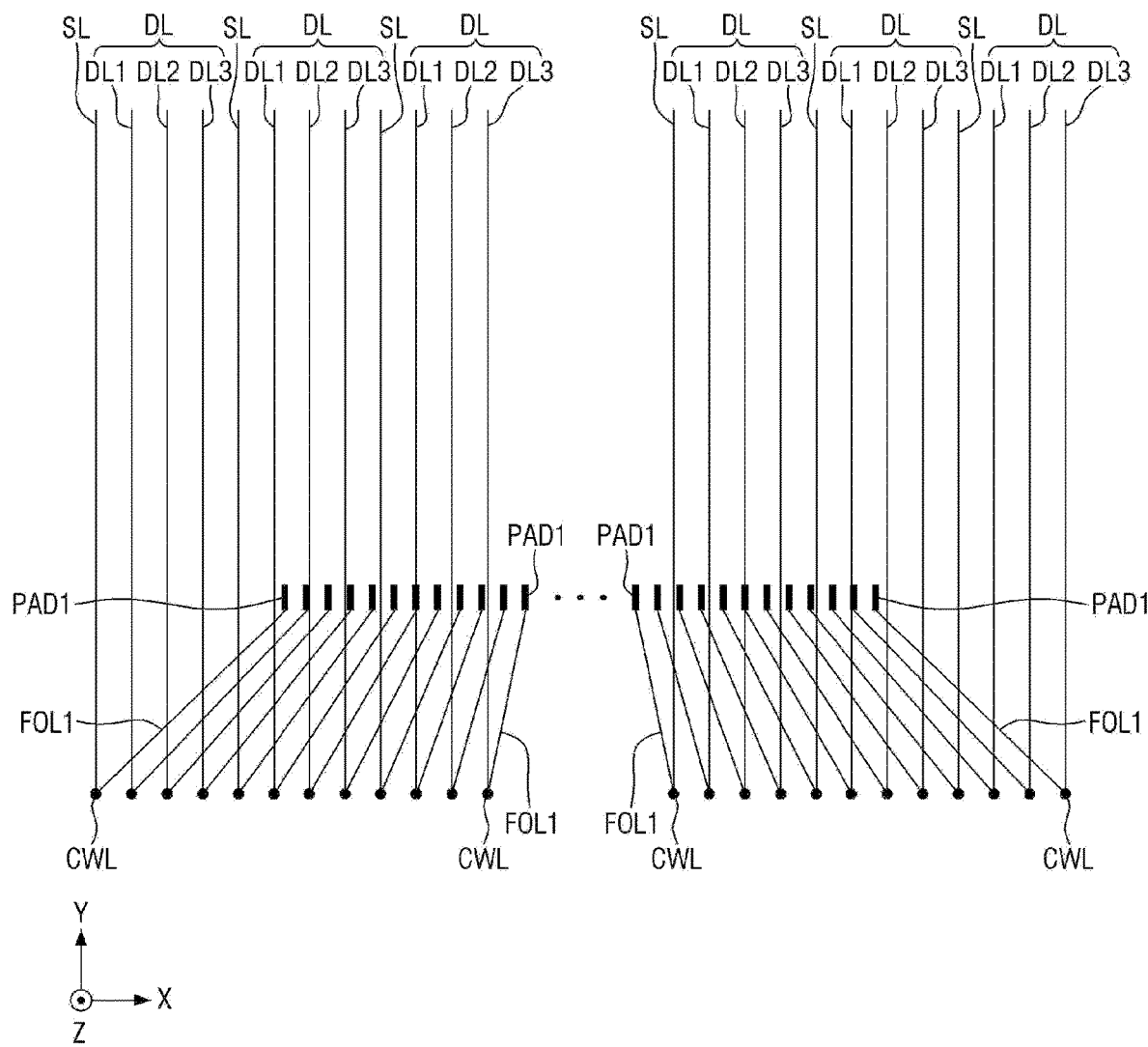
FIG. 5 is a schematic view illustrating first pad parts, first fan-out lines, sensing lines, and data lines in the display device according to an embodiment.
Figure 6:
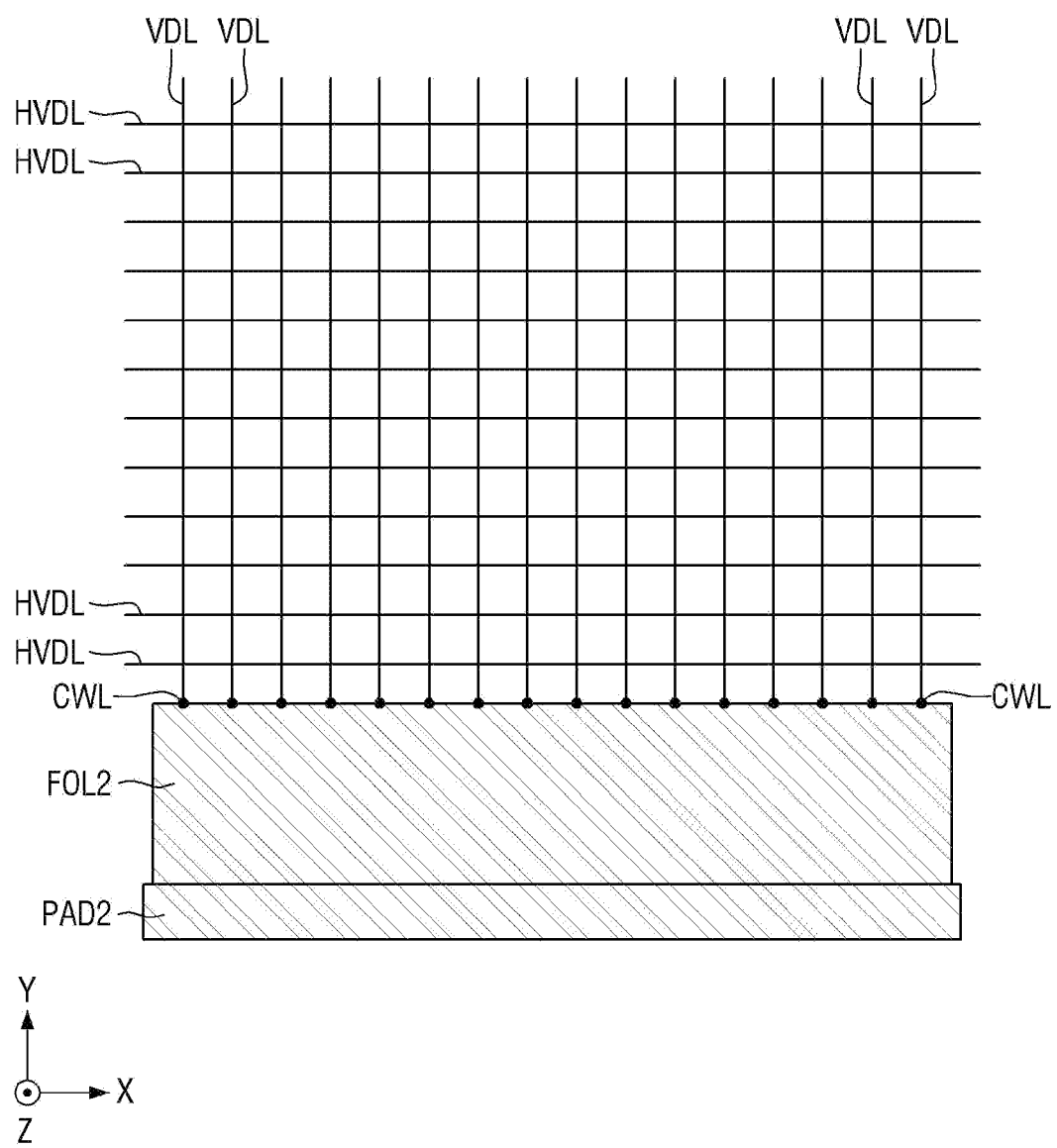
FIG. 6 is a schematic view illustrating second pad parts, second fan-out lines, high potential lines, and horizontal voltage lines in the display device according to an embodiment.

FIG. 5 is a schematic view illustrating first pad parts, first fan-out lines, sensing lines, and data lines in the display device according to an embodiment. FIG. 6 is a schematic view illustrating second pad parts, second fan-out lines, high potential lines, and horizontal voltage lines in the display device according to an embodiment, and FIG. 7 is a schematic view illustrating second pad parts, second fan-out lines, low potential lines, and vertical voltage lines in the display device according to an embodiment.

Figure 7:
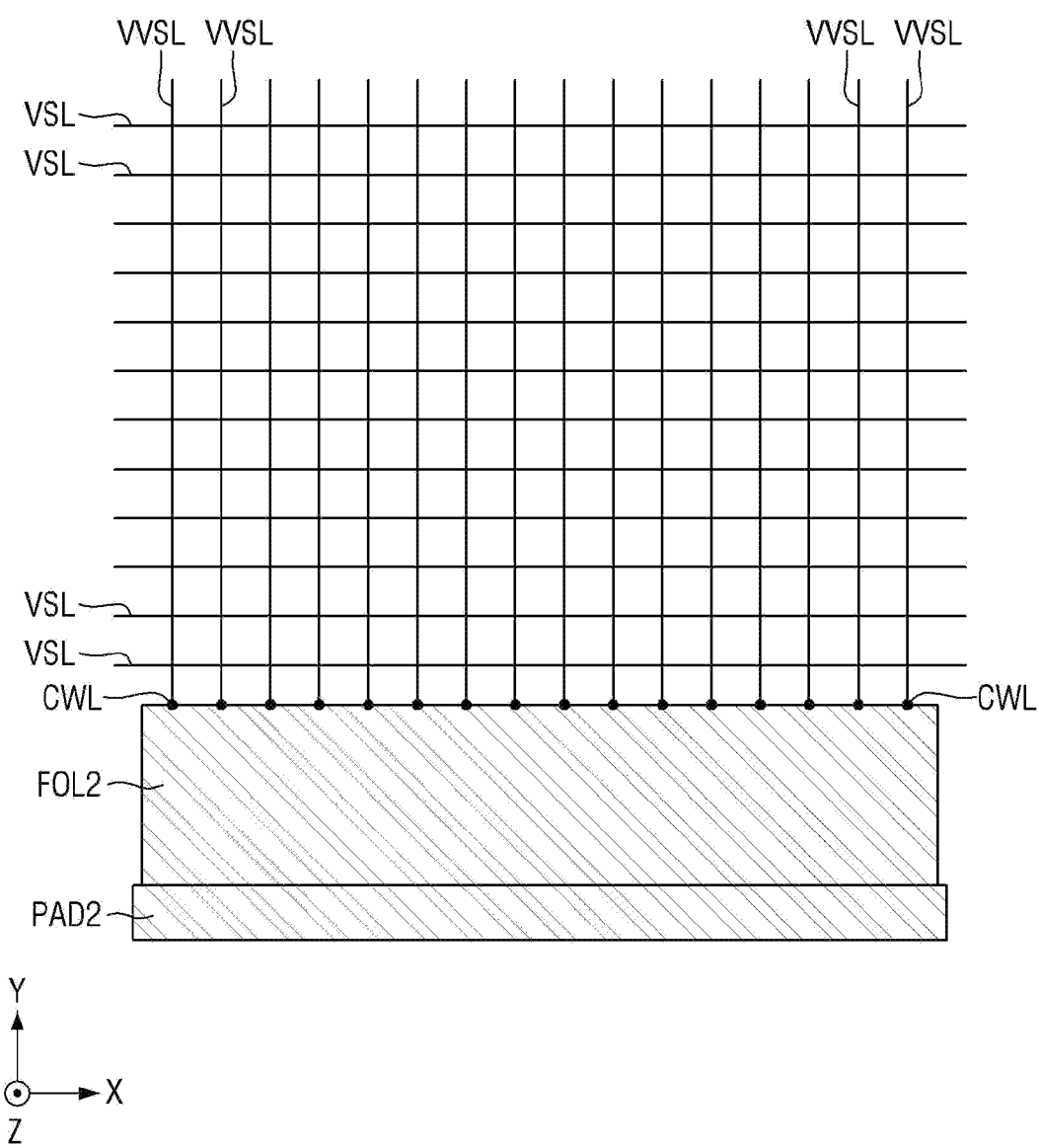
FIG. 7 is a schematic view illustrating second pad parts, second fan-out lines, low potential lines, and vertical voltage lines in the display device according to an embodiment.

Referring to FIGS. 5 to 7, the display area DA may include sensing lines SL, data lines DL, high potential lines VDL, horizontal voltage lines HVDL, low potential lines VSL, and vertical voltage lines VVSL.

The sensing lines SL may extend in the second direction (or in the Y-axis direction) and may be spaced apart from each other in the first direction (or in the X-axis direction). Referring to FIG. 2, the sensing lines SL may be included in the second metal layer MTL2 and extend in the second direction (or in the Y-axis direction). The sensing line SL may be electrically connected to the first fan-out line FOL1 of the first metal layer MTL1 through the connection part CWL. For example, the sensing lines SL may be electrically connected to the first fan-out lines FOL1 through the connection parts CWL, respectively. The sensing line SL may cross the first fan-out line FOL1 in a plan view. The sensing line SL may receive an initialization voltage through the first pad part PAD1. The sensing line SL may provide a sensing signal to the first pad part PAD1.

The data lines DL may include first to third data lines DL1, DL2, and DL3. The first to third data lines DL1, DL2, and DL3 may extend in the second direction (or in the Y-axis direction) and may be spaced apart from each other in the first direction (or in the X-axis direction). Referring to FIG. 2, the data lines DL may be included in the second metal layer MTL2 and extend in the second direction (or in the Y-axis direction). The data line DL may be electrically connected to the first fan-out line FOL1 of the first metal layer MTL1 through the connection part CWL. For example, the data lines DL may be electrically connected to the first fan-out lines FOL1 through the connection parts CWL, respectively. The data line DL may cross the first fan-out line FOL1 in a plan view. The data line DL may receive a data voltage through the first pad part PAD1.

The high potential lines VDL may extend in the second direction (or in the Y-axis direction) and may be spaced apart from each other in the first direction (or in the X-axis direction). The high potential lines VDL may be electrically connected to the horizontal voltage lines HVDL intersecting (or crossing) the high potential lines VDL, and may supply high potential voltages to the horizontal voltage lines HVDL. Referring to FIG. 2, the high potential lines VDL may be included in the second metal layer MTL2 and extend in the second direction (or in the Y-axis direction). The high potential line VDL may be electrically connected to the second fan-out line FOL2 of the first metal layer MTL1 through the connection part CWL. For example, the high potential lines VDL may be electrically connected to the second fan-out line FOL2 through the connection parts CWL, respectively. The high potential line VDL may receive the high potential voltage through the second pad part PAD2.

The horizontal voltage lines HVDL may extend in the first direction (or in the X-axis direction) and may be spaced apart from each other in the second direction (or in the Y-axis direction). The horizontal voltage lines HVDL may be electrically connected to the high potential lines VDL intersecting (or crossing) the horizontal voltage lines HVDL, and may receive the high potential voltages from the high potential lines VDL. Referring to FIG. 2, the horizontal voltage lines HVDL may be included in the fourth metal layer MTL4 and extend in the first direction (or in the X-axis direction).

The vertical voltage lines VVSL may extend in the second direction (or in the Y-axis direction) and may be spaced apart from each other in the first direction (or in the X-axis direction). The vertical voltage lines VVSL may be electrically connected to the low potential lines VSL intersecting (or crossing) the vertical voltage lines VVSL, and may supply low potential voltages to the low potential lines VSL. Referring to FIG. 2, the vertical voltage lines VVSL may be included in the second metal layer MTL2 and extend in the second direction (or in the Y-axis direction). The vertical voltage line VVSL may be electrically connected to the second fan-out line FOL2 of the first metal layer MTL1 through the connection part CWL. For example, the vertical voltage lines VVSL may be electrically connected to the second fan-out line FOL2 through the connection parts CWL, respectively. The vertical voltage line VVSL may receive the low potential voltage through the second pad part PAD2.

The low potential lines VSL may extend in the first direction (or in the X-axis direction) and may be spaced apart from each other in the second direction (or in the Y-axis direction). The low potential lines VSL may be electrically connected to the vertical voltage lines VVSL intersecting (or crossing) the low potential lines VSL, and may receive the low potential voltages from the vertical voltage lines VVSL. Referring to FIG. 2, the low potential lines VSL may be included in the fourth metal layer MTL4 and extend in the first direction (or in the X-axis direction).

Figure 8:
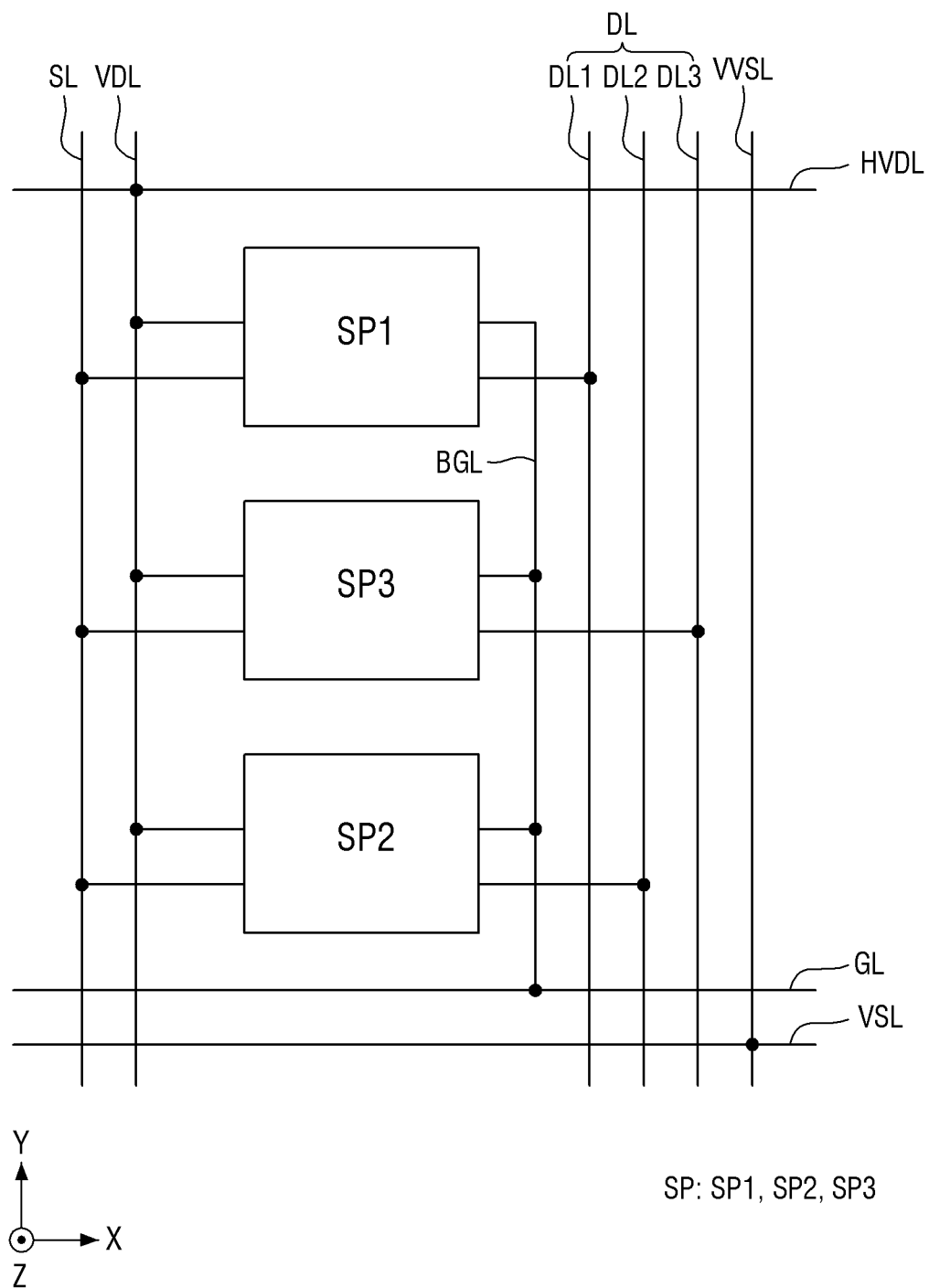
FIG. 8 is a schematic block diagram illustrating pixels and lines of the display device according to an embodiment.
Figure 9:
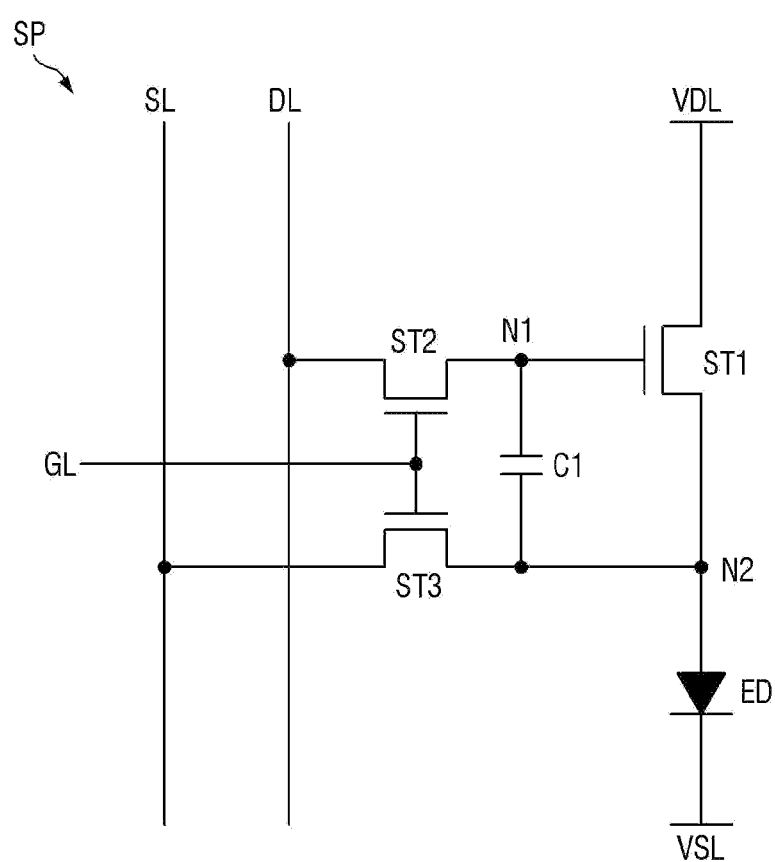
FIG. 9 is a schematic diagram of an equivalent circuit illustrating the pixel of FIG. 8.

FIG. 8 is a schematic block diagram illustrating pixels and lines of the display device according to an embodiment, and FIG. 9 is a schematic diagram of an equivalent circuit illustrating the pixel of FIG. 8.

Referring to FIGS. 8 and 9, the pixels SP may include a first pixel SP1, a second pixel SP2, and a third pixel SP3. A pixel circuit of the first pixel SP1, a pixel circuit of the third pixel SP3, and a pixel circuit of the second pixel SP2 may be arranged in a direction opposite to the second direction (or the Y-axis direction), but the order of the pixel circuits is not limited thereto.

Each of the first to third pixels SP1, SP2, and SP3 may be electrically connected to a high potential line VDL, a sensing line SL, a gate line GL, and a data line DL.

The high potential line VDL may extend in the second direction (or in the Y-axis direction). The high potential line VDL may be disposed on a left side of the pixel circuits of the first to third pixels SP1, SP2, and SP3. The high potential line VDL may supply a high potential voltage to a transistor of each of the first to third pixels SP1, SP2, and SP3.

The horizontal voltage line HVDL may extend in the first direction (or in the X-axis direction). The horizontal voltage line HVDL may be disposed on an upper side of the pixel circuit of the first pixel SP1. The horizontal voltage line HVDL may be electrically connected to the high potential line VDL. The horizontal voltage line HVDL may receive the high potential voltage from the high potential line VDL.

The sensing line SL may extend in the second direction (or in the Y-axis direction). The sensing line SL may be disposed on a left side of the high potential line VDL. The sensing line SL may supply the initialization voltage to the pixel circuit of each of the first to third pixels SP1, SP2, and SP3. The sensing line SL may receive the sensing signal from each of the pixel circuits of the first to third pixels SP1, SP2, and SP3 and supply the sensing signal to the display driver DIC.

The gate line GL may extend in the first direction (or in the X-axis direction). Referring to FIG. 2, the gate line GL may be included in the third metal layer MTL3 or the fourth metal layer MTL4. The gate line GL may be disposed on a lower side of the pixel circuit of the second pixel SP2. The gate line GL may be disposed on an upper side of the low potential line VSL. The gate line GL may supply a gate signal to an auxiliary gate line BGL.

The auxiliary gate line BGL may extend in the second direction (or in the Y-axis direction) from the gate line GL. Referring to FIG. 2, the auxiliary gate line BGL may be included in the third metal layer MTL3. A portion of the auxiliary gate line BGL may be a gate electrode GE of a second transistor ST2, and another portion of the auxiliary gate line BGL may be a gate electrode GE of a third transistor ST3. The auxiliary gate line BGL may be disposed on a right side of the pixel circuits of the first to third pixels SP1, SP2, and SP3. The auxiliary gate line BGL may supply the gate signal received from the gate line GL to the pixel circuits of the first to third pixels SP1, SP2, and SP3.

The data line DL may extend in the second direction (or in the Y-axis direction). The data line DL may supply the data voltage to the pixel SP. The data line DL may include a first data line DL1, a second data line DL2, and a third data line DL3.

The first data line DL1 may extend in the second direction (or in the Y-axis direction). The first data line DL1 may be disposed on a right side of the auxiliary gate line BGL. The first data line DL1 may supply the data voltage received from the display driver DIC to the pixel circuit of the first pixel SP1.

The second data line DL2 may extend in the second direction (or in the Y-axis direction). The second data line DL2 may be disposed on a right side of the first data line DL1. The second data line DL2 may supply the data voltage received from the display driver DIC to the pixel circuit of the second pixel SP2.

The third data line DL3 may extend in the second direction (or in the Y-axis direction). The third data line DL3 may be disposed on a right side of the second data line DL2. The third data line DL3 may supply the data voltage received from the display driver DIC to the pixel circuit of the third pixel SP3.

The vertical voltage line VVSL may extend in the second direction (or in the Y-axis direction). The vertical voltage line VVSL may be disposed on a right side of the third data line DL3. The vertical voltage line VVSL may be electrically connected to the low potential line VSL, and may supply the low potential voltage to the low potential line VSL.

The low potential line VSL may extend in the first direction (or in the X-axis direction). The low potential line VSL may be disposed on a lower side of the gate line GL. The low potential line VSL may supply the low potential voltage received from the vertical voltage line VVSL to light emitting elements ED of the first to third pixels SP1, SP2, and SP3.

Each of the first to third pixels SP1, SP2, and SP3 may include a pixel circuit and a light emitting element ED (or multiple light emitting elements ED). The pixel circuit of each of the first to third pixels SP1, SP2, and SP3 may include a first transistor ST1, the second transistor ST2, the third transistor ST3, and a first capacitor C1.

The first transistor ST1 may include a gate electrode, a drain electrode, and a source electrode. The gate electrode of the first transistor ST1 may be electrically connected to a first node N1, the drain electrode of the first transistor ST1 may be electrically connected to the high potential line VDL, and the source electrode of the first transistor ST1 may be electrically connected to a second node N2. The first transistor ST1 may control a drain-source current (or a driving current) based on the data voltage applied to the gate electrode.

The light emitting element ED may include at least one light emitting element ED. When the light emitting element ED includes multiple light emitting elements ED, the light emitting elements ED may be electrically connected to each other in series or in parallel. The light emitting element ED may receive the driving current from the first transistor ST1 and emit light. A light emission amount or luminance of the light emitting element ED may be proportional to a magnitude of the driving current. The light emitting element ED may be an inorganic light emitting element including an inorganic semiconductor, but is not limited thereto.

A first electrode of the light emitting element ED may be electrically connected to the second node N2, and a second electrode of the light emitting element ED may be electrically connected to the low potential line VSL. The first electrode of the light emitting element ED may be electrically connected to the source electrode of the first transistor ST1, a drain electrode of the third transistor ST3, and a second capacitor electrode of the first capacitor C1 through the second node N2.

The second transistor ST2 may be turned on by the gate signal of the gate line GL and electrically connect the data line DL and the first node N1, which is the gate electrode of the first transistor ST1, to each other. The second transistor ST2 may be turned on based on the gate signal and supply the data voltage to the first node N1. A gate electrode of the second transistor ST2 may be electrically connected to the gate line GL, a drain electrode of the second transistor ST2 may be electrically connected to the data line DL, and a source electrode of the second transistor ST2 may be electrically connected to the first node N1.

The third transistor ST3 may be turned on by the gate signal of the gate line GL and electrically connect the sensing line SL and the second node N2, which is the source electrode of the first transistor ST1, to each other. The third transistor ST3 may be turned on based on the gate signal and supply the initialization voltage to the second node N2. The third transistor ST3 may supply the sensing signal to the sensing line SL. A gate electrode of the third transistor ST3 may be electrically connected to the gate line GL, the drain electrode of the third transistor ST3 may be electrically connected to the second node N2, and a source electrode of the third transistor ST3 may be electrically connected to the sensing line SL.

Figure 10:
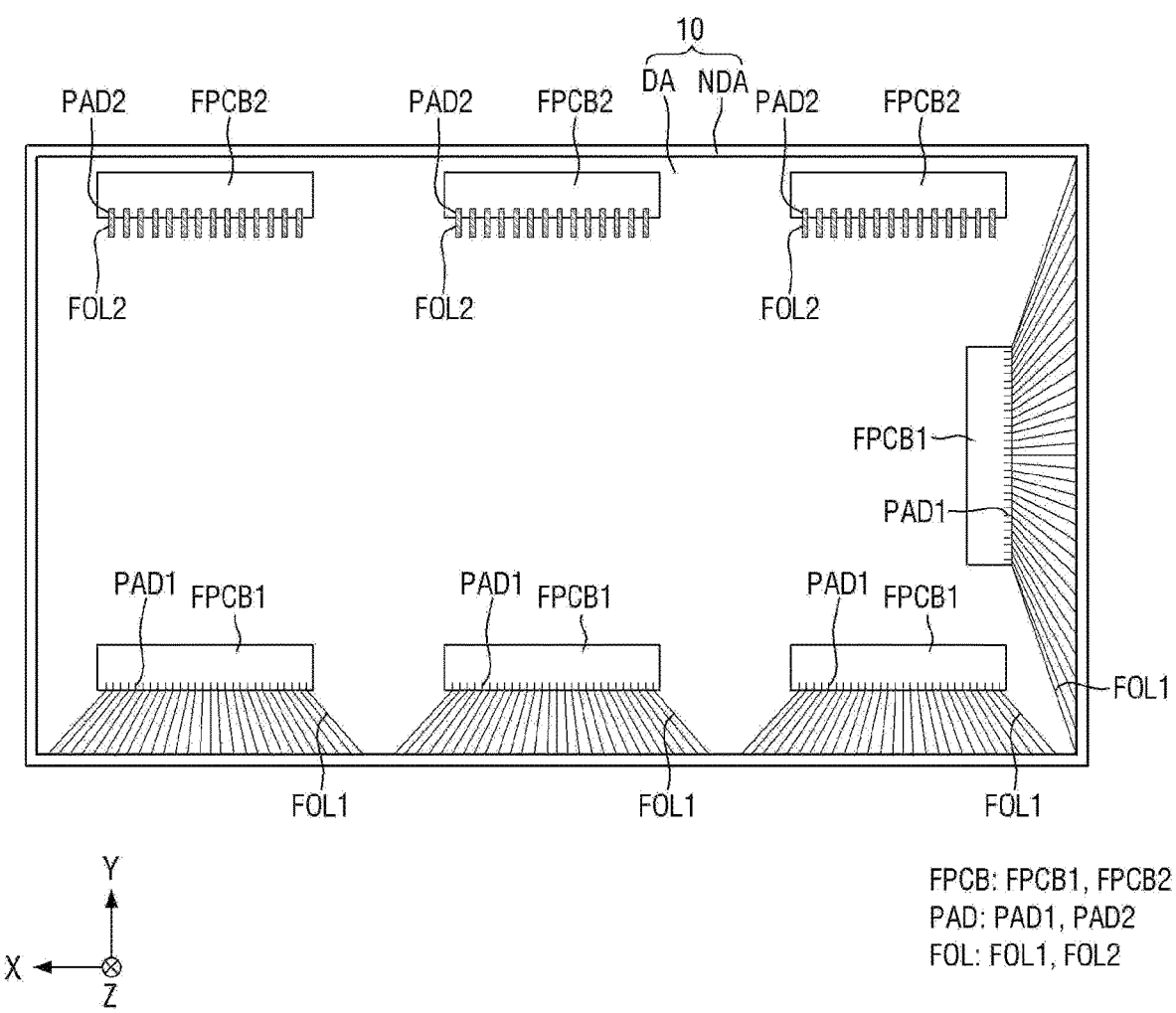
FIG. 10 is a schematic bottom view illustrating a display device according to another embodiment.
Figure 11:
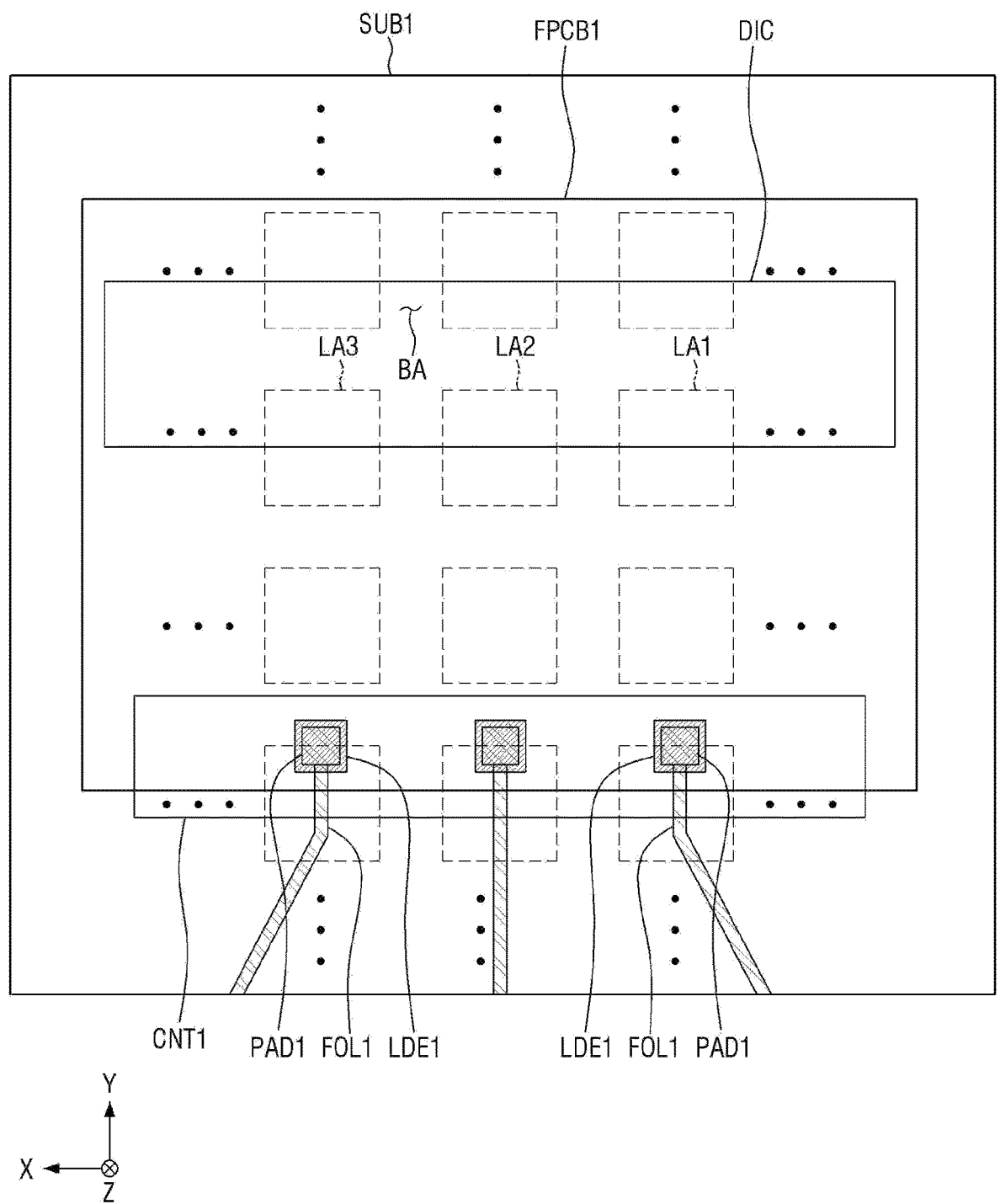
FIG. 11 is a schematic enlarged bottom view illustrating a portion of the display device according to another embodiment.
Figure 12:
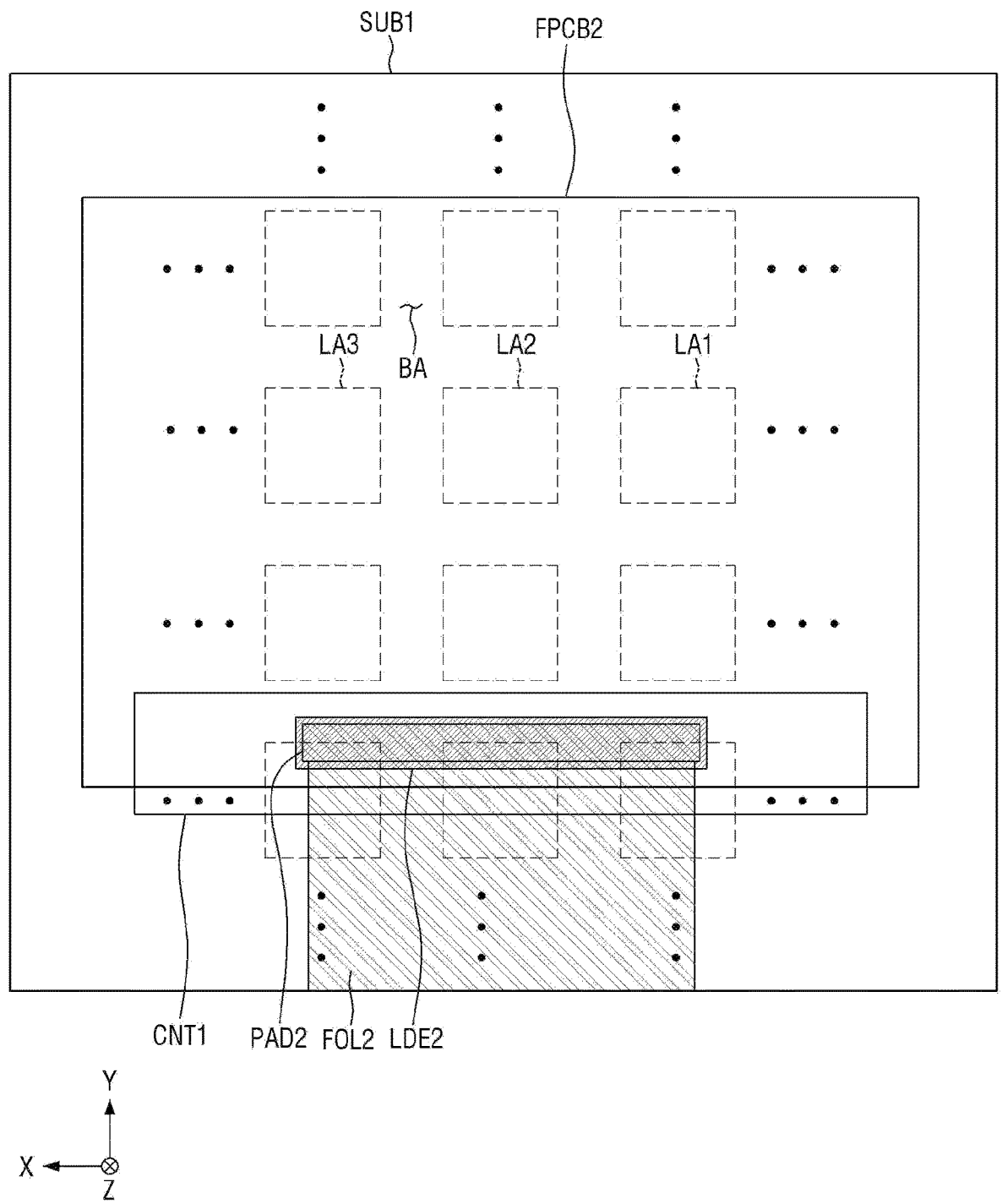
FIG. 12 is a schematic enlarged bottom view illustrating another portion of the display device according to another embodiment.

FIG. 10 is a schematic bottom view illustrating a display device according to another embodiment, FIG. 11 is a schematic enlarged bottom view illustrating a portion of the display device according to another embodiment, and FIG. 12 is a schematic enlarged bottom view illustrating another portion of the display device according to another embodiment.

Referring to FIGS. 10 to 12, a flexible film FPCB, a pad part PAD, and a fan-out line FOL may be disposed in a display area DA.

The flexible film FPCB may include first flexible films FPCB1 and second flexible films FPCB2. The first and second flexible films FPCB1 and FPCB2 may be disposed below a first substrate SUB1. The first and second flexible films FPCB1 and FPCB2 may be disposed at edges of a lower surface of the display device 10. For example, some of the first flexible films FPCB1 may be disposed at an edge of a first long side of the display device 10, and others of the first flexible films FPCB1 may be disposed at an edge of a short side of the display device 10. The second flexible films FPCB2 may be disposed at an edge of a second long side of the display device 10 opposite to the first long side. The first flexible films FPCB1 disposed at the edge of the first long side of the display device 10 may supply data voltages, the first flexible films FPCB1 disposed at the edge of the short side of the display device 10 may supply gate signals, and the second flexible films FPCB2 disposed at the edge of the second long side of the display device 10 may supply power voltages, but the disclosure is not limited thereto.

The pad part PAD may include first pad parts PAD1 and second pad parts PAD2. The first and second pad parts PAD1 and PAD2 may be inserted into second contact holes CNT2 of a first barrier insulating layer BIL and may be exposed through first contact holes CNT1 of the first substrate SUB1. The first pad parts PAD1 disposed at the edge of the first long side of the display device 10 may be arranged in a first direction (or in an X-axis direction). The first pad parts PAD1 disposed at the edge of the short side of the display device 10 may be arranged in the second direction (or in the Y-axis direction). The second pad parts PAD2 disposed at the edge of the second long side of the display device 10 may be arranged in the first direction (or in the X-axis direction).

As an example, an area of the second pad part PAD2 may be greater than an area of the first pad part PAD1. The first pad parts PAD1 may be individual pads, and the second pad part PAD2 may be an integrated pad. For example, the first pad parts PAD1 may be individually connected to lines (e.g., data lines DL, sensing lines SL of FIG. 5 or the like), respectively, and each of the second pad parts PAD2 may be integrally connected to multiple lines (e.g., high potential lines VDL of FIG. 6). However, the disclosure is not limited thereto. The area of the second pad part PAD2 may be several to several tens of times the area of the first pad part PAD1. As another example, the first and second pad parts PAD1 and PAD2 may be individual pads having a same size.

The fan-out line FOL may include first fan-out lines FOL1 and second fan-out lines FOL2. The first fan-out lines FOL1 and the first pad parts PAD1 may be integral with each other. The first fan-out lines FOL1 may extend from the first pad parts PAD1 to an edge of the display device 10. For example, the first fan-out lines FOL1 disposed at the edge of the first long side of the display device 10 may extend in a direction opposite to the second direction (or the Y-axis direction) of the first flexible films FPCB1. The first fan-out lines FOL1 disposed at the edge of the short side of the display device 10 may extend in a direction opposite to the first direction (or the X-axis direction) of the first flexible films FPCB1. The first fan-out lines FOL1 may be electrically connected to the data lines or the gate lines of the display area DA through connection parts CWL (e.g., refer to FIG. 2).

The second fan-out lines FOL2 and the second pad parts PAD2 may be integral with each other. The second fan-out lines FOL2 may extend from the second pad parts PAD2 toward a center of the display device 10. The second fan-out lines FOL2 disposed at the edge of the second long side of the display device 10 may extend in a direction opposite to the second direction (or the Y-axis direction) of the second flexible films FPCB2. The second fan-out lines FOL2 may be electrically connected to power lines of the display area DA through the connection parts CWL. For example, a width of the second fan-out line FOL2 may be greater than a width of the first fan-out line FOL1. The width of the second fan-out line FOL2 may be several to several tens of times the width of the first fan-out line FOL1. The first fan-out lines FOL1 may be disposed at the edge of the first long side of the display device 10, and the second fan-out lines FOL2 may be disposed at the edge of the second long side of the display device 10. Thus, a degree of freedom in design of the first and second fan-out lines FOL1 and FOL2 may be improved. The second fan-out line FOL2 may have a relatively great width, and line resistance may be relatively decreased. Accordingly, the display device 10 may decrease heat generation of the second fan-out lines FOL2, and may prevent a risk of a short-circuit between the first and second fan-out lines FOL1 and FOL2.

The first flexible film FPCB1 may include a first lead electrode LDE1 (or multiple first lead electrodes LDE1). Each of first pad parts PAD1 may correspond to each of the first lead electrodes LDE1. The first lead electrode LDE1 may be electrically connected to the first pad part PAD1 through a connection film ACF (e.g., refer to FIG. 2).

The second flexible film FPCB2 may include a second lead electrode LDE2 (or multiple second lead electrodes LDE2). Each of the second pad parts PAD2 may correspond to each of the second lead electrodes LDE2. The second lead electrode LDE2 may be electrically connected to the second pad part PAD2 through the connection film ACF. As an example, an area of the second lead electrode LDE2 may be greater than an area of the first lead electrode LDE1. The first lead electrodes LDE1 may be individual electrodes, and the second lead electrode LDE2 may be an integrated electrode. For example, the first lead electrodes LDE1 may be individually connected to the lines (e.g., the data lines DL, the sensing lines SL of FIG. 5 or the like), respectively, and each of the second lead electrodes LDE2 may be integrally connected to multiple lines (e.g., high potential lines VDL of FIG. 6). However, the disclosure is not limited thereto. The area of the second lead electrode LDE2 may be several to several tens of times the area of the first lead electrode LDE1. As another example, the first and second lead electrodes LDE1 and LDE2 may be individual pads having a same size.

Figure 13:
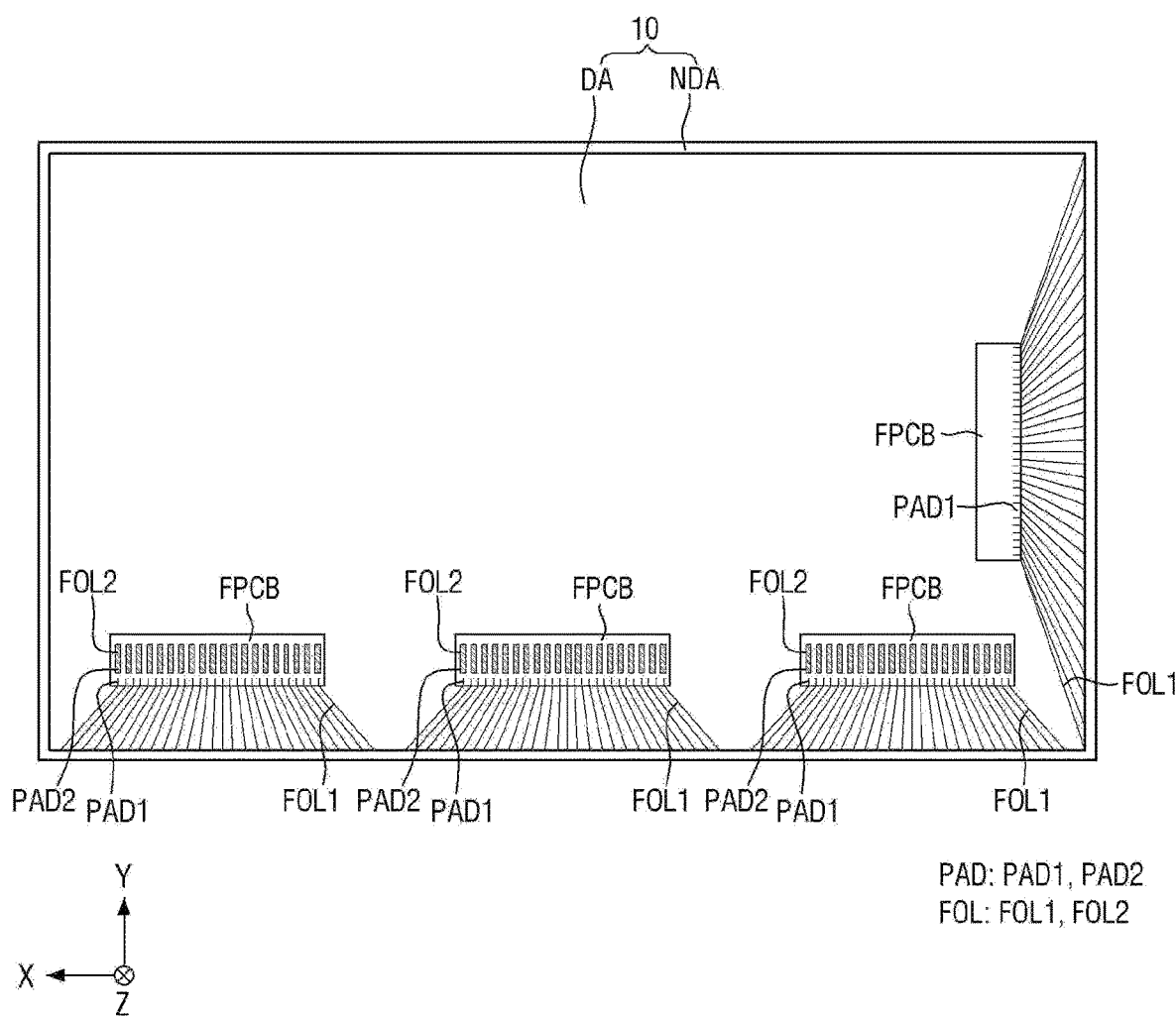
FIG. 13 is a schematic bottom view illustrating a display device according to still another embodiment.
Figure 14:
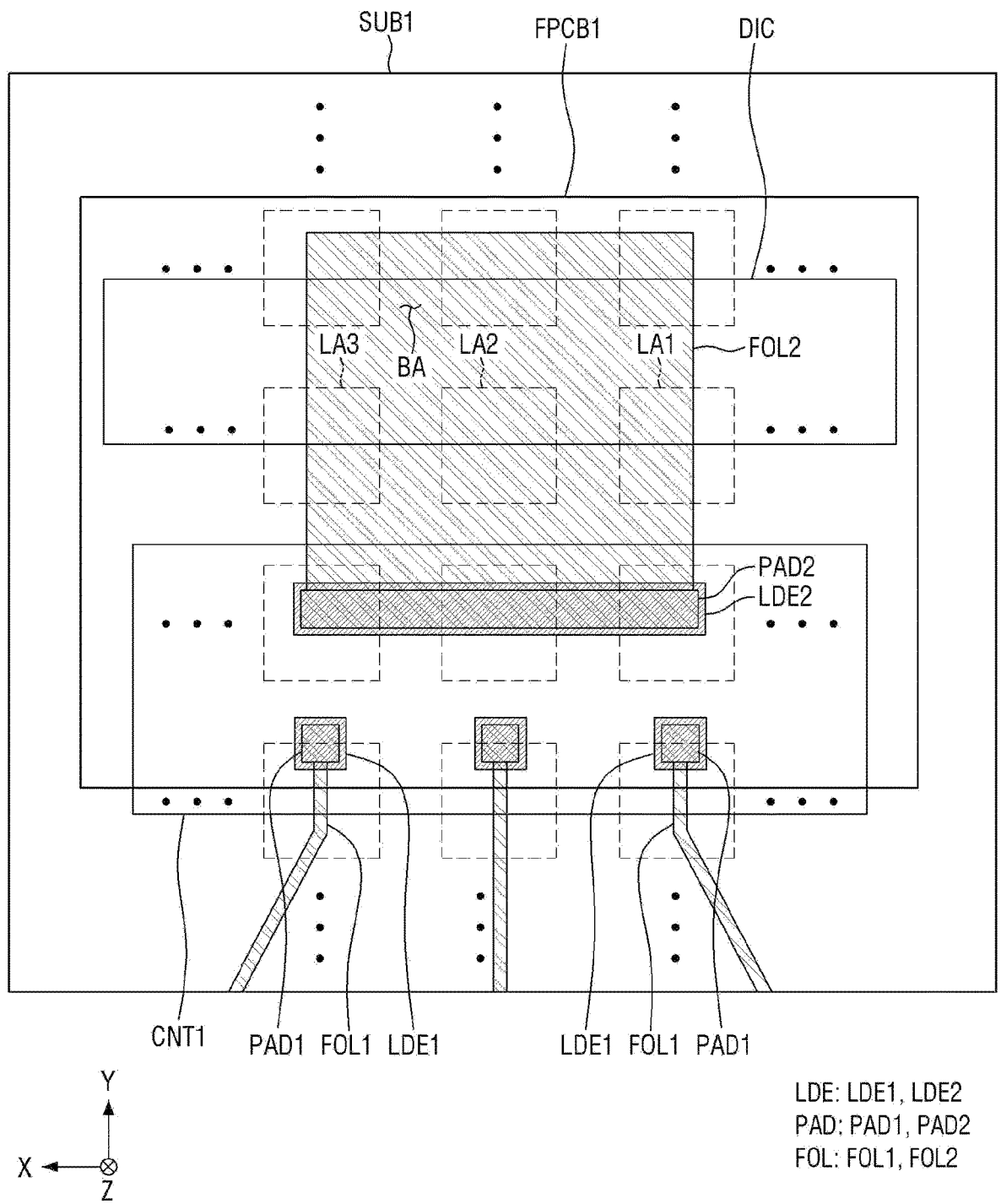
FIG. 14 is a schematic enlarged bottom view illustrating a portion of the display device according to still another embodiment.

FIG. 13 is a schematic bottom view illustrating a display device according to still another embodiment, and FIG. 14 is a schematic enlarged bottom view illustrating a portion of the display device according to still another embodiment.

Referring to FIGS. 13 and 14, a flexible film FPCB, a pad part PAD, and a fan-out line FOL may be disposed in a display area DA.

The flexible film FPCB (or multiple flexible films FPCB) may be disposed below a first substrate SUB1. The flexible film FPCB may be disposed at an edge of a lower surface of the display device 10. For example, some of the flexible films FPCB may be disposed at an edge of a long side of the display device 10, and others of the flexible films FPCB may be disposed at an edge of a short side of the display device 10. The flexible films FPCB disposed at the edge of the long side of the display device 10 may supply data voltages and power voltages, and the flexible films FPCB disposed at the edge of the short side of the display device 10 may supply gate signals, but the disclosure is not limited thereto.

The pad part PAD may include first pad parts PAD1 and second pad parts PAD2. The first and second pad parts PAD1 and PAD2 may be inserted into second contact holes CNT2 of a first barrier insulating layer BIL1 and may be exposed through first contact holes CNT1 of the first substrate SUB1. The first pad parts PAD1 disposed at the edge of the long side of the display device 10 may be arranged in a first direction (or in an X-axis direction). The first and second pad parts PAD1 and PAD2 disposed at the edge of the long side of the display device 10 may be spaced apart from each other in a second direction (or in a Y-axis direction). The second pad parts PAD2 may be disposed on an upper side of the first pad parts PAD1, and may be arranged in the first direction (or in the X-axis direction). The first pad parts PAD1 disposed at the edge of the short side of the display device 10 may be arranged in the second direction (or in the Y-axis direction).

As an example, an area of the second pad part PAD2 may be greater than an area of the first pad part PAD1. The first pad parts PAD1 may be individual pads, and the second pad part PAD2 may be an integrated pad. For example, the first pad parts PAD1 may be individually connected to lines (e.g., data lines DL, sensing lines SL of FIG. 5 or the like), respectively, and each of the second pad parts PAD2 may be integrally connected to multiple lines (e.g., high potential lines VDL of FIG. 6). However, the disclosure is not limited thereto. The area of the second pad part PAD2 may be several to several tens of times the area of the first pad part PAD1. As another example, the first and second pad parts PAD1 and PAD2 may be individual pads having a same size.

The fan-out line FOL may include first fan-out lines FOL1 and second fan-out lines FOL2. The first fan-out lines FOL1 and the first pad parts PAD1 may be integral with each other. The first fan-out lines FOL1 may extend from the first pad parts PAD1 to an edge of the display device 10. For example, the first fan-out lines FOL1 disposed at the edge of the long side of the display device 10 may extend in a direction opposite to the second direction (or the Y-axis direction) of the first contact holes CNT1. The first fan-out lines FOL1 disposed at the edge of the short side of the display device 10 may extend in a direction opposite to the first direction (or the X-axis direction) of the first contact holes CNT1. The first fan-out lines FOL1 may be electrically connected to the data lines or the gate lines of the display area DA through connection parts CWL (e.g., refer to FIG. 2).

The second fan-out lines FOL2 and the second pad parts PAD2 may be integral with each other. The second fan-out lines FOL2 may extend from the second pad parts PAD2 toward a center of the display device 10. For example, the second fan-out lines FOL2 may extend in the second direction (or in the Y-axis direction) of the first contact holes CNT1. The second fan-out lines FOL2 may be electrically connected to power lines of the display area DA through the connection parts CWL. For example, a width of the second fan-out line FOL2 may be greater than a width of the first fan-out line FOL1. The width of the second fan-out line FOL2 may be several to several tens of times the width of the first fan-out line FOL1. The second fan-out lines FOL2 may extend in a direction different from that of the first fan-out lines FOL1. Thus, an interval between the first and second fan-out lines FOL1 and FOL2 may be increased and a degree of freedom in design of the first and second fan-out lines FOL1 and FOL2 may be improved. The second fan-out line FOL2 may have a relatively great width, and line resistance may be relatively decreased. Accordingly, the display device 10 may decrease heat generation of the second fan-out lines FOL2, and may prevent a risk of a short-circuit between the first and second fan-out lines FOL1 and FOL2.

The lead electrode LDE of the flexible film FPCB may include first lead electrodes LDE1 and second lead electrodes LDE2. Each of the first pad parts PAD1 may correspond to each of the first lead electrodes LDE1. The first lead electrode LDE1 may be electrically connected to the first pad part PAD1 through the connection film ACF. Each of the second pad parts PAD2 may correspond to each of the second lead electrodes LDE2. The second lead electrode LDE2 may be electrically connected to the second pad part PAD2 through the connection film ACF. As an example, an area of the second lead electrode LDE2 may be greater than an area of the first lead electrode LDE1. The first lead electrodes LDE1 may be individual electrodes, and the second lead electrode LDE2 may be an integrated electrode. For example, the first lead electrodes LDE1 may be individually connected to the lines (e.g., the data lines DL, the sensing lines SL of FIG. 5 or the like), respectively, and each of the second lead electrodes LDE2 may be integrally connected to the multiple lines (e.g., the high potential lines VDL of FIG. 6). However, the disclosure is not limited thereto. The area of the second lead electrode LDE2 may be several to several tens of times the area of the first lead electrode LDE1. As another example, the first and second lead electrodes LDE1 and LDE2 may be individual pads having a same size.

Figure 15:
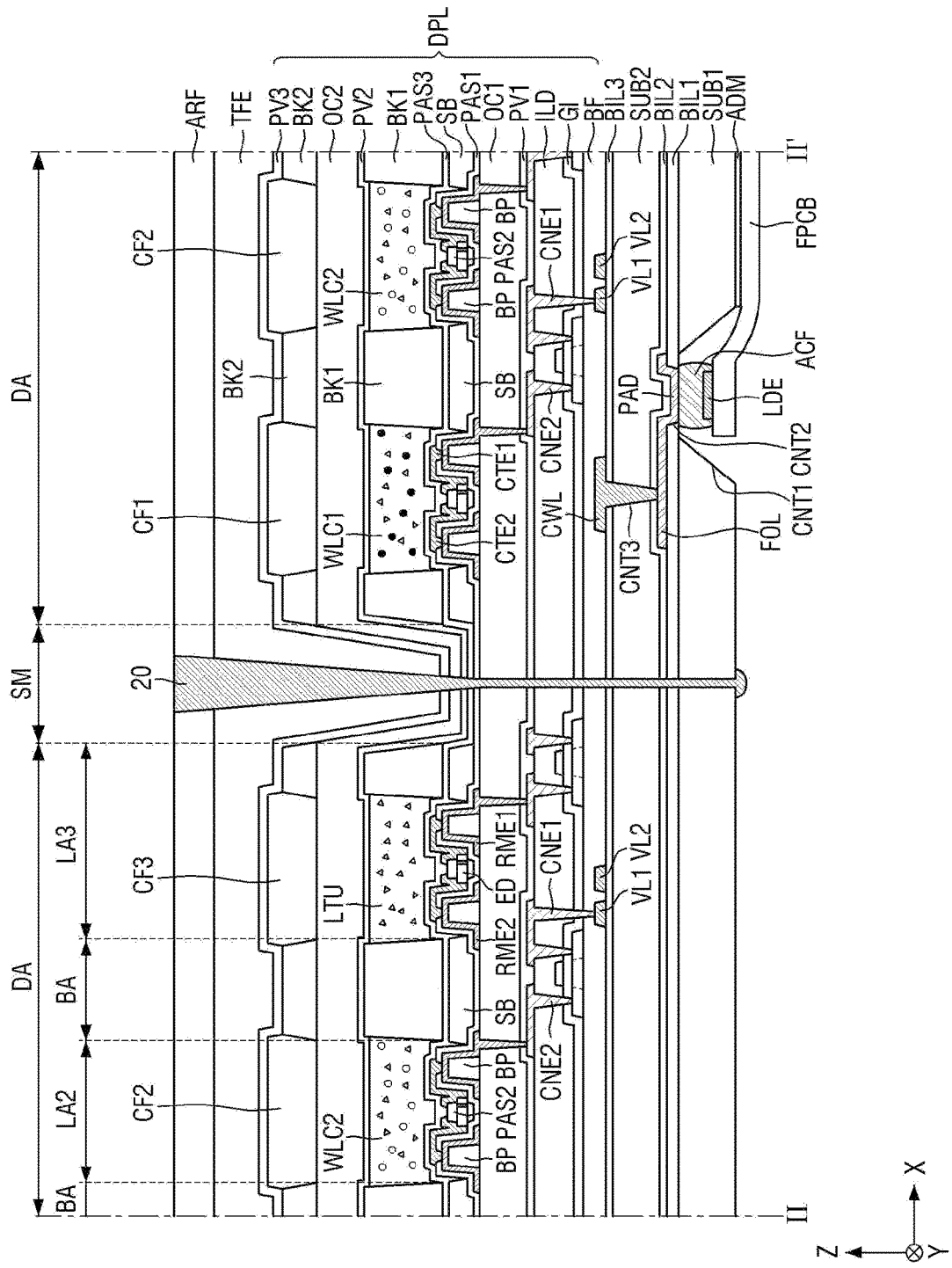
FIG. 15 is a schematic cross-sectional view taken along line II-IF of FIG. 1.

FIG. 15 is a schematic cross-sectional view taken along line II-IF of FIG. 1.

Referring to FIG. 15, the tiled display device TD may include multiple display devices 10 and coupling members 20. The tiled display device TD may include a first display device 10-1, a second display device 10-2, a third display device 10-3, and a fourth display device 10-4. The number of display devices 10 and a coupling relationship between the display devices 10 are not limited to those of the embodiment of FIG. 1. The number of display devices 10 may be determined according to sizes of each of the display devices 10 and the tiled display device TD.

Each of the display devices 10 may include a display area DA and a non-display area NDA. The display area DA may include pixels to display an image. The non-display area NDA may be disposed around the display area DA and may be adjacent to (e.g., surround) the display area DA. The non-display area NDA may not display an image.

The tiled display device TD may include coupling areas SM disposed between the display areas DA (e.g., disposed between adjacent ones of the display areas DA). The non-display areas NDA of adjacent display devices 10 may be connected to each other, and the tiled display device TD may be formed. The display devices 10 may be connected to each other through the coupling members 20 or adhesive members disposed in the coupling areas SM. Each of the coupling areas SM of each of the display devices 10 may not include pad parts or fan-out lines electrically connected to the pad parts. Accordingly, a distance between the display areas DA of each of the display devices 10 may be decreased, and the coupling areas SM may not be recognized by the user. The display areas DA of each of the display devices 10 and the coupling areas SM may have substantially a same external light reflectivity. Accordingly, a sense of discontinuity (e.g., visual discontinuity) between the display devices 10 may be removed from the tiled display device TC, and recognition of the coupling areas SM between the display devices 10 by the user may be prevented. Thus, image display quality (e.g., a degree of immersion of an image) may be improved.

In the tiled display device TD, side surfaces of adjacent display devices 10 may be coupled to each other using the coupling members 20 disposed between the display devices 10. The coupling members 20 may connect the side surfaces of the first to fourth display devices 10-1 to 10-4 arranged in a lattice shape to each other and implement the tiled display device TD. The coupling members 20 may couple side surfaces of first substrates SUB1, side surfaces of first and second barrier insulating layers BIL1 and BIL2, side surfaces of second substrates SUB2, side surfaces of third barrier insulating layers BIL3, side surfaces of display layers DPL, side surfaces of encapsulation layers TFE, and side surfaces of anti-reflection films ARF of the adjacent display devices 10 to each other.

As an example, the coupling member 20 may be formed of an adhesive or a double-sided tape having a relatively small thickness and minimize an interval between the display devices 10. As another example, the coupling member 20 may be formed of a coupling frame having a relatively small thickness and minimize an interval between the display devices 10. Accordingly, the tiled display device TD may prevent the coupling areas SM between the display devices 10 from being recognized by the user.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
   a first substrate including a first contact hole;
   fan-out lines disposed at a first metal layer on the first substrate and formed integrally with first and second pad parts exposed to a lower portion of the first substrate;
   a display layer disposed on the fan-out lines; and
   a flexible film disposed below the first substrate and inserted into the first contact hole to be electrically connected to the first and second pad parts,
   wherein the fan-out lines comprise:
      first fan-out lines formed integrally with the first pad parts and extending in a first direction of the first contact hole; and
      second fan-out lines formed integrally with the second pad parts and extending in a direction opposite to the first direction of the first contact hole,
   wherein the first and second pad parts include a plurality of first and second pad parts arranged in a second direction crossing the first direction, and
   the first pad parts are disposed at a center of the first contact hole, and the second pad parts are disposed on both sides of the first pad parts.

2. The display device of claim 1, further comprising:
   a first barrier insulating layer disposed on the first substrate and including a second contact hole, wherein the first and second pad parts are inserted into the second contact hole to be exposed to the lower portion of the first substrate.

3. The display device of claim 2, further comprising:
a second substrate disposed on the fan-out lines and formed of the same material as the first substrate,
wherein the display layer is disposed on the second substrate.

4. The display device of claim 3, wherein the display layer comprises:
a connection part and a data line disposed at a second metal layer on the first metal layer, wherein
the data line is electrically connected to the first fan-out lines through the connection part.

5. The display device of claim 4, wherein the display layer further comprises a thin film transistor,
the thin film transistor includes:
a semiconductor region;
a drain electrode;
a source electrode disposed at an active layer on the second metal layer; and
a gate electrode disposed at a third metal layer on the active layer, and
the thin film transistor receives a data voltage from the data line.

6. The display device of claim 1, wherein an area of the second pad part is greater than an area of the first pad part.

7. The display device of claim 1, wherein a width of each of the second fan-out lines is greater than a width of each of the first fan-outlines.

8. The display device of claim 1, wherein each of the first fan-out lines supplies a data voltage to the display layer, and each of the second fan-out lines supplies a power voltage to the display layer.

9. The display device of claim 1, wherein the display layer comprises a data line disposed at a second metal layer on the first metal layer and extending in the first direction, and
the data line intersections at least one of the first fan-out lines in a plan view.

10. The display device of claim 1, wherein the display layer comprises:
a high potential line disposed at the second metal layer on the first metal layer and extending in the first direction; and
a horizontal voltage line disposed at a third metal layer on the second metal layer, extending in a second direction intersecting the first direction, and connected to the high potential line, and
the high potential line receives a high potential voltage from the second fan-out lines.

11. The display device of claim 1, wherein the display layer comprises:
a vertical voltage line disposed at the second metal layer on the first metal layer and extending in the first direction; and
a low potential line disposed at a third metal layer on the second metal layer, extending in a second direction intersecting the first direction, and connected to the vertical voltage line, and
the vertical voltage line receives a low potential voltage from the second fan-out lines.

12. The display device of claim 1, further comprising:
a display driver mounted on the flexible film and supplying a data voltage to the display layer.

13. A tiled display device comprising:
a plurality of display devices each including a display area including a plurality of pixels and a non-display area surrounding the display area; and
a coupling member coupling the plurality of display devices to each other, wherein each of the plurality of display devices comprises:
a first substrate including a first contact hole;
fan-out lines disposed at a first metal layer on the first substrate and formed integrally with first and second pad parts exposed to a lower portion of the first substrate;
a display layer disposed on the fan-out lines; and
a flexible film disposed below the first substrate and inserted into the first contact hole to be electrically connected to the first and second pad parts,
the fan-out lines including:
first fan-out lines formed integrally with the first pad parts and extending in a first direction of the first contact hole; and
second fan-out lines formed integrally with the second pad parts and extending in a direction opposite to the first direction of the first contact hole,
wherein the first and second pad parts include a plurality of first and second pad parts arranged in a second direction crossing the first direction, and
the first pad parts are disposed at a center of the first contact hole, and the second pad parts are disposed on both sides of the first pad parts.

14. The display device of claim 13, wherein the first fan-out lines extend to an edge of the first substrate, and the second fan-out lines extend diagonally toward a center of the first substrate.

15. The display device of claim 13, wherein an area of the second pad part is greater than an area of the first pad part.

16. The display device of claim 13, wherein a width of each of the second fan-out lines is greater than a width of each of the first fan-out lines.

17. A display device comprising:
a first substrate including a first contact hole;
fan-out lines disposed at a first metal layer on the first substrate and formed integrally with first and second pad parts exposed to a lower portion of the first substrate;
a display layer disposed on the fan-out lines; and
a flexible film disposed below the first substrate and inserted into the first contact hole to be electrically connected to the first and second pad parts,
wherein the fan-out lines comprise:
first fan-out lines formed integrally with the first pad parts and extending in a first direction of the first contact hole; and
second fan-out lines formed integrally with the second pad parts and extending in a direction opposite to the first direction of the first contact hole, wherein
the first fan-out lines extends to an edge of the first substrate, and
the second fan-out lines extend diagonally toward a center of the first substrate,
the first and second pad parts include a plurality of first and second pad parts,
the first pad parts are disposed at a center of the first contact hole, and
the second pad parts are disposed on both sides of the first pad parts.

* * * * *